(12) United States Patent
Park et al.

(10) Patent No.: US 12,526,972 B2
(45) Date of Patent: Jan. 13, 2026

(54) SEMICONDUCTOR DEVICE

(71) Applicant: SAMSUNG ELECTRONICS CO., LTD., Suwon-si (KR)

(72) Inventors: Dong-Sik Park, Suwon-si (KR); Sooho Shin, Suwon-si (KR); Cheolho Baek, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 424 days.

(21) Appl. No.: 18/097,675

(22) Filed: Jan. 17, 2023

(65) Prior Publication Data

US 2023/0328951 A1 Oct. 12, 2023

(30) Foreign Application Priority Data

Apr. 11, 2022 (KR) .................. 10-2022-0044559

(51) Int. Cl.
*H10B 12/00* (2023.01)
(52) U.S. Cl.
CPC ......... *H10B 12/033* (2023.02); *H10B 12/315* (2023.02); *H10B 12/50* (2023.02)
(58) Field of Classification Search
None
See application file for complete search history.

(56) References Cited

U.S. PATENT DOCUMENTS

| 6,500,678 | B1 | 12/2002 | Aggarwal et al. |
| 6,982,472 | B2 | 1/2006 | Kiyotoshi |
| 7,396,772 | B2 | 7/2008 | Lee et al. |
| 7,871,891 | B2 | 1/2011 | Cho et al. |
| 8,546,232 | B2 | 10/2013 | Sako |
| 8,648,441 | B2 | 2/2014 | Hijioka et al. |
| 9,330,960 | B2 | 5/2016 | Cho et al. |
| 9,431,403 | B2 | 8/2016 | Komeda |
| 2017/0186752 | A1 | 6/2017 | Choi et al. |
| 2021/0375877 | A1 | 12/2021 | Kim et al. |
| 2023/0146012 | A1 | 5/2023 | Jang et al. |

FOREIGN PATENT DOCUMENTS

| KR | 10-2007-0009285 A | 1/2007 |
| KR | 10-0668836 B1 | 1/2007 |
| KR | 10-2010-0085391 A | 7/2010 |
| KR | 10-2017-0075975 A | 7/2017 |
| KR | 10-2021-0147321 A | 12/2021 |
| KR | 10-2023-0066194 A | 5/2023 |
| TW | 428316 B | 4/2001 |
| TW | 200426896 A | 12/2004 |
| TW | 201208029 A1 | 2/2012 |

*Primary Examiner* — Anthony Ho

(74) *Attorney, Agent, or Firm* — Sughrue Mion, PLLC

(57) ABSTRACT

A semiconductor device may include a substrate including a cell array region, a data storage structure provided on the cell array region of the substrate, the data storage structure including a bottom electrode, a top electrode on the bottom electrode, and a dielectric layer interposed between the bottom electrode and the top electrode, a blocking layer provided on a top surface of the top electrode, a lower interlayer insulating layer provided on the blocking layer, and a lower contact penetrating the lower interlayer insulating layer and electrically connected to the top electrode. At least a portion of a side surface of the lower contact may contact the blocking layer.

20 Claims, 26 Drawing Sheets

SEMICONDUCTOR DEVICE

CROSS-REFERENCE TO RELATED APPLICATION

This application is based on and claims priority under 35 U.S.C. § 119 to Korean Patent Application No. 10-2022-0044559, filed on Apr. 11, 2022, in the Korean Intellectual Property Office, the contents of which are incorporated by reference herein in their entirety.

BACKGROUND

The disclosure relates to a semiconductor device, and in particular, to a semiconductor device including a blocking layer.

Due to their small-sized, multifunctional, and/or low-cost characteristics, semiconductor devices are esteemed as important elements in the electronics industry. With the advancement of the electronics industry, there is an increasing demand for a semiconductor device with higher integration density. Semiconductor devices are classified into a semiconductor memory device for storing data, a semiconductor logic device for processing data, and a hybrid semiconductor device including both of memory and logic elements. In addition, there is an increasing demand for semiconductor devices with improved characteristics. For example, there is an increasing demand for semiconductor devices with high reliability, high performance, and/or multiple functions. To meet this demand, structural complexity and/or integration density of semiconductor devices are being increased.

SUMMARY

An embodiment of the disclosure provides a semiconductor device with improved electric characteristics.

In accordance with an aspect of the disclosure, a semiconductor device includes a substrate including a cell array region; a data storage structure provided on the cell array region of the substrate, the data storage structure including a bottom electrode, a top electrode on the bottom electrode, and a dielectric layer interposed between the bottom electrode and the top electrode; a blocking layer provided on a top surface of the top electrode; a lower interlayer insulating layer provided on the blocking layer; and a lower contact penetrating the lower interlayer insulating layer, wherein the lower contact is electrically connected to the top electrode, wherein at least a portion of a side surface of the lower contact contacts the blocking layer.

In accordance with an aspect of the disclosure, a semiconductor device includes a substrate including a cell array region; a data storage structure provided on the cell array region of the substrate; a blocking layer provided on a top surface of the data storage structure; a lower interlayer insulating layer provided on the blocking layer; a lower contact penetrating the lower interlayer insulating layer, wherein the lower contact is electrically connected to the data storage structure; a lower interconnection layer provided on the lower interlayer insulating layer, wherein the lower interconnection layer is electrically connected to the lower contact; an interface layer covering the lower interconnection layer; and an upper interlayer insulating layer provided on the interface layer, wherein a bottom surface of the lower contact is located between a top surface of the blocking layer and a bottom surface of the blocking layer.

In accordance with an aspect of the disclosure, a semiconductor device includes a substrate including a cell array region and a peripheral circuit region; a data storage structure provided on the cell array region of the substrate, the data storage structure including a bottom electrode, a top electrode on the bottom electrode, and a dielectric layer between the bottom electrode and the top electrode; peripheral transistors provided on the peripheral circuit region of the substrate; a blocking layer provided on a top surface of the top electrode; a lower interlayer insulating layer provided on the data storage structure and the peripheral transistors; a lower contact penetrating the lower interlayer insulating layer, wherein the lower contact is electrically connected to the data storage structure; a low-k dielectric layer provided on the lower interlayer insulating layer; a first lower interconnection layer provided to penetrate the low-k dielectric layer, wherein a first portion of the first lower interconnection layer is electrically connected to the lower contact and a second portion of the first lower interconnection layer is electrically connected to the peripheral transistors; an interface layer covering the first lower interconnection layer; a first upper interlayer insulating layer provided on the interface layer; an upper contact provided to penetrate the first upper interlayer insulating layer and the interface layer, wherein a first portion of the upper contact is connected to the first portion of the first lower interconnection layer and a second portion of the upper contact is connected to the second portion of the first lower interconnection layer; a first upper interconnection layer and a second upper interconnection layer provided on the first upper interlayer insulating layer, wherein the first upper interconnection layer is electrically connected to the first portion of the upper contact and the second upper interconnection layer is electrically connected to the second portion of the upper contact; a second upper interlayer insulating layer covering the first upper interconnection layer and the second upper interconnection layer; and a passivation layer on the second upper interlayer insulating layer, wherein at least a portion of a side surface of the lower contact contacts the blocking layer.

DETAILED DESCRIPTION

Example embodiments of the disclosure will now be described more fully with reference to the accompanying drawings, in which example embodiments are shown.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present. Like numerals refer to like elements throughout.

Spatially relative terms, such as "over," "above," "on," "upper," "below," "under," "beneath," "lower," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

For the sake of brevity, conventional elements to semiconductor devices may or may not be described in detail herein for brevity purposes.

Figure 1:
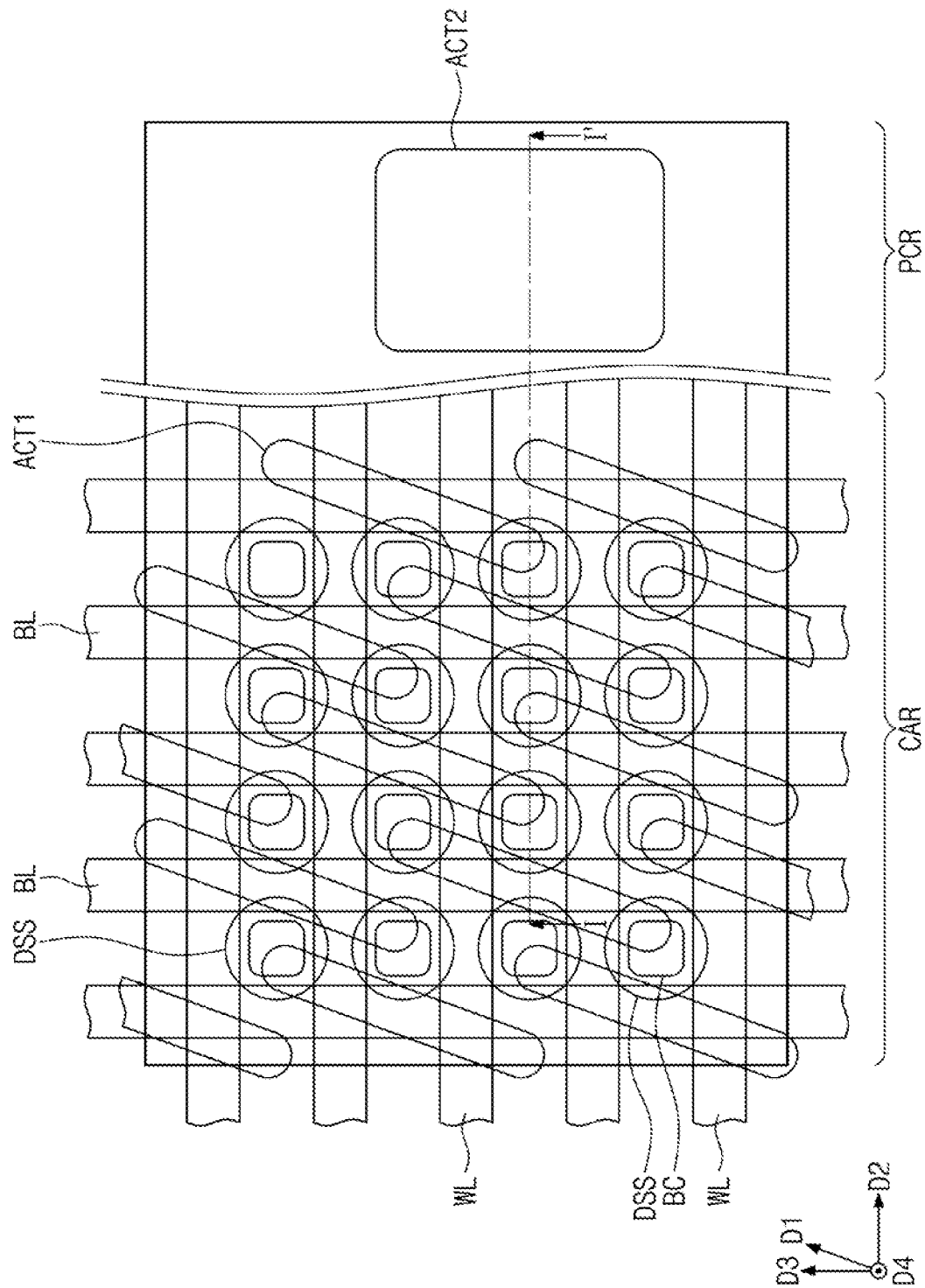
FIG. 1 is a plan view illustrating a semiconductor device according to an embodiment.
Figure 2:
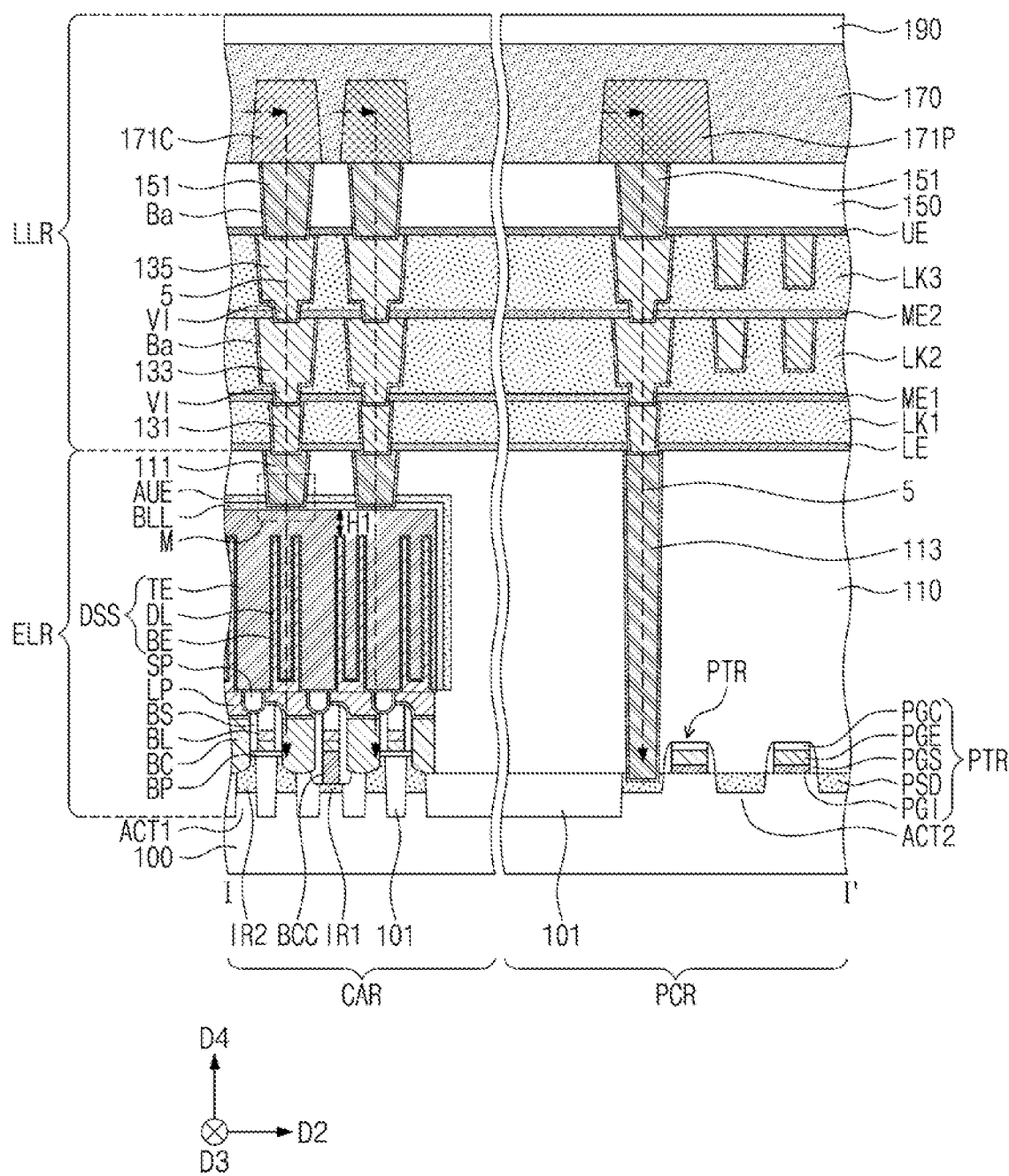
FIG. 2 is a sectional view taken along a line I-I' of FIG. 1 to illustrate a semiconductor device according to an embodiment.
Figure 3:
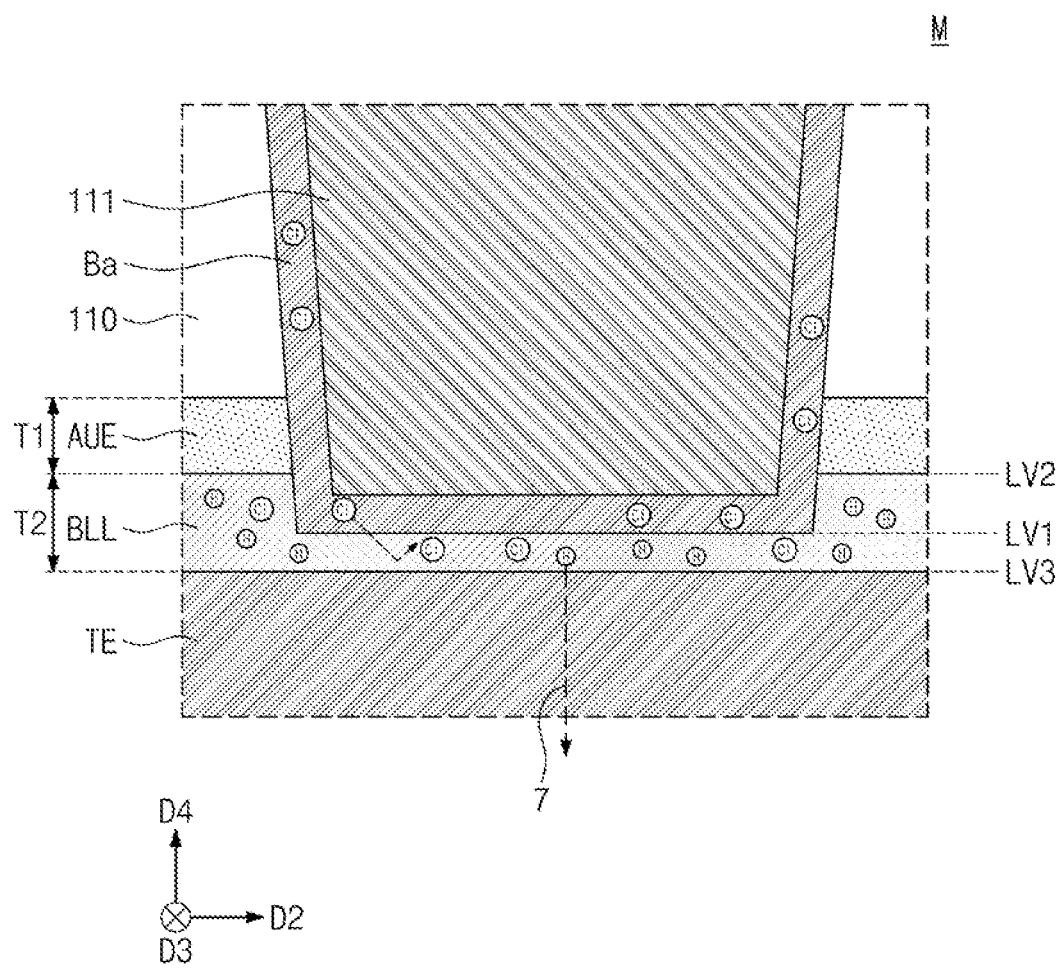
FIG. 3 is an enlarged sectional view illustrating a portion 'M' of FIG. 2.

FIG. 1 is a plan view illustrating a semiconductor device according to an embodiment. FIG. 2 is a sectional view taken along a line I-I' of FIG. 1 to illustrate a semiconductor device according to an embodiment. FIG. 3 is an enlarged sectional view illustrating a portion 'M' of FIG. 2.

Referring to FIGS. 1 and 2, a semiconductor device may include an integrated circuit region ELR on a substrate 100 and an interconnection region LLR on the integrated circuit region ELR. The integrated circuit region ELR may include a plurality of transistors and/or a plurality of circuits which are provided on the substrate 100. The interconnection region LLR may be a region, in which a plurality of interconnection lines connected to the transistors and/or the circuits are provided.

In the case where the semiconductor device is a memory device, the integrated circuit region ELR may include a cell array, which is provided in a cell array region CAR, and peripheral circuits, which are provided in a peripheral circuit region PCR and are used to drive the cell array. The cell array may include cell transistors, and the peripheral circuits may include peripheral transistors PTR. In an embodiment, the peripheral circuit region PCR may be provided to enclose the cell array region CAR.

The cell array region CAR may be a region, in which memory cells are disposed. A word line driver, a sense amplifier, row and column decoders, and control circuits may be disposed in the peripheral circuit region PCR. In the case where the semiconductor device is not a memory device, the integrated circuit region ELR may not include the cell array of the cell array region CAR. The description that follows will refer to an example in which the semiconductor device is the memory device, but the disclosure is not limited to this example.

The integrated circuit region ELR on the cell array region CAR may include first active regions ACT1, which are provided on the substrate 100 and are defined by a device isolation layer 101, cell transistors, which are provided on the first active regions ACT1, and a data storage structure DSS connected to the cell transistor.

In an embodiment, the substrate 100 may be a semiconductor substrate, which is formed of or includes at least one of silicon, germanium, and silicon-germanium. The first active regions ACT1 may be bar-shaped portions, which are provided in an upper portion of the substrate 100, are horizontally spaced apart from each other, and are extended in a first direction D1 parallel to a top surface of the substrate 100. As shown, e.g., in FIG. 1, the first direction D1 may be a direction that is not perpendicular to both of second and third directions D2 and D3, which are parallel to the top surface of the substrate 100.

A pair of word lines WL may be provided on each of the first active regions ACT1. The word lines WL may be buried in the substrate 100 and may be extended in the second direction D2 to cross the first active regions ACT1. The word lines WL may be spaced apart from each other in the third direction D3. A gate insulating layer may be interposed between the word line WL and the substrate 100 and between the word line WL and the device isolation layer 101. The gate insulating layer may be provided to enclose side and bottom surfaces of the word line WL.

First impurity regions IR1 and second impurity regions IR2 may be provided in the first active regions ACT1. The first impurity regions IR1 and the second impurity regions IR2 may have a conductivity type that is different from that of the substrate 100. The first impurity region IR1 may be disposed in a portion of each of the first active regions ACT1 located between the pair of the word lines WL, and the second impurity regions IR2 may be disposed in opposite edge portions of each of the first active regions ACT1. The first impurity region IR1 and the second impurity region IR2 may be respectively disposed at both sides of each word line WL. Each word line WL may correspond to a gate electrode of the cell transistor, and the first and second impurity regions IR1 and IR2 at both sides thereof may correspond to source/drain regions of the cell transistor.

A buffer pattern BP may be provided on the top surface of the substrate 100. The buffer pattern BP may be formed of or include at least one of insulating materials and may have a single- or multi-layered structure. Bit line contacts BCC may be provided on the first active regions ACT1. The bit line contacts BCC may be extended in a fourth direction D4, which is perpendicular to the top surface of the substrate 100, to penetrate the buffer pattern BP. The bit line contacts BCC may be connected to the first impurity regions IR1, respectively.

Bit lines BL may be provided to cross the word lines WL or to extend in the third direction D3. The bit lines BL may be spaced apart from each other in the second direction D2. The bit lines BL may be provided to cross a plurality of the first active regions ACT1. The bit lines BL may be in contact with the buffer pattern BP and the bit line contacts BCC. Each of the bit lines BL may include a first conductive pattern, a second conductive pattern, and a capping pattern, which are sequentially stacked. Spacers BS may be provided to cover opposite side surfaces of the first and second conductive patterns and the capping pattern. Node contacts BC, which are connected to the data storage structure DSS, may be provided between adjacent ones of the bit lines BL. The node contacts BC may be connected to the second impurity regions IR2, respectively.

Landing pads LP may be provided on the node contacts BC. The landing pads LP may be separated from each other by a separation pattern SP. The data storage structure DSS may be provided on the landing pads LP. In an embodiment, the data storage structure DSS may be a capacitor. The data storage structure DSS may include a bottom electrode BE, a top electrode TE on the bottom electrode BE, and a dielectric layer DL between the bottom and top electrodes BE and TE. In an embodiment, the data storage structure DSS may further include supporting patterns that are used to support side surfaces of the bottom electrode BE.

The bottom electrode BE of the data storage structure DSS may have a pillar shape or a cylinder shape with a closed bottom surface. The bottom electrode BE may be formed of or include at least one of, for example, doped poly silicon, metallic materials, metal nitride materials, metal silicide materials, or poly silicide. The dielectric layer DL may be provided to conformally cover the bottom electrode BE. The dielectric layer DL may be formed of or include at least one of oxides, nitrides, silicides, oxynitrides, and silicon oxynitrides, and may contain one of hafnium (Hf), aluminum (Al), zirconium (Zr), or lanthanum (La). The top electrode TE may cover the dielectric layer DL. In the case where the bottom electrode BE has a cylinder shape with a closed bottom surface, the top electrode TE may be provided to fill an inner space of the cylindrical bottom electrode BE. In an embodiment, the top electrode TE may be formed of or include silicon-germanium doped with impurities. The top electrode TE may further contain boron (B).

The above description refers to an example in which the integrated circuit region ELR on the cell array region CAR includes a dynamic random access memory (DRAM) structure, but the disclosure is not limited to this example. For example, the semiconductor device may include a memory device including a variable resistance element (e.g., a phase change material).

The integrated circuit region ELR on the peripheral circuit region PCR may include a second active region ACT2, which is defined by the device isolation layer 101, and the peripheral transistors PTR, which are provided on the second active region ACT2. Each of the peripheral transistors PTR may include a peripheral gate insulating layer PGI, a peripheral gate electrode PGE, and a peripheral gate capping layer PGC, which are sequentially stacked on the second active region ACT2. Each of the peripheral transistors PTR may further include peripheral gate spacers PGS, which are provided to cover opposite side surfaces of the peripheral gate insulating layer PGI, the peripheral gate electrode PGE, and the peripheral gate capping layer PGC, and source/drain regions PSD, which are provided at both sides of the peripheral gate electrode PGE.

A blocking layer BLL may be provided on the top electrode TE of the data storage structure DSS. The blocking layer BLL may be conformally provided on the top electrode TE. The blocking layer BLL may be extended to cover top and side surfaces of the top electrode TE.

The blocking layer BLL may be formed of or include at least one of silicon-based materials or silicon-nitride-based materials. For example, the blocking layer BLL may be formed of or include at least one of silicon (Si), silicon germanium (SiGe), silicon nitride (SiN), silicon oxynitride (SiON), silicon carbonitride (SiCN), silicon boron nitride (SiBN), and carbon- and nitride-doped silicon oxide (SiCON).

An auxiliary electrode AUE may be provided on the blocking layer BLL. The auxiliary electrode AUE may be conformally provided on the blocking layer BLL. The blocking layer BLL may be interposed between the top electrode TE and the auxiliary electrode AUE. The auxiliary electrode AUE may be extended along the top and side surfaces of the top electrode TE. In an embodiment, the auxiliary electrode AUE may be formed of or include the same material as the top electrode TE. As an example, the auxiliary electrode AUE may be formed of or include silicon-germanium doped with impurities.

A vertical distance between the blocking layer BLL, which is provided on the top surface of the top electrode TE, and the dielectric layer DL may be a first distance H1 as shown, e.g., in FIG. 2.

A lower interlayer insulating layer 110 may be provided to cover the peripheral transistors PTR on the peripheral circuit region PCR and the data storage structure DSS on the cell array region CAR. In an embodiment, the lower interlayer insulating layer 110 may be formed of or include any one of borophosphosilicate glass (BPSG), tonen silazane (TOSZ), undoped silicate glass (USG), spin-on glass (SOG), flowable oxide (FOX), tetraethyl orthosilicate (TEOS), high-density-plasma chemical-vapor-deposition (HDP CVD) dielectric materials, or hydrogen silsesquioxane (HSQ). The blocking layer BLL and the auxiliary electrode AUE may be interposed between the top electrode TE and the lower interlayer insulating layer 110.

The interconnection region LLR on the integrated circuit region ELR may include interlayer insulating layers, low-k dielectric layers, and interconnection layers formed therein. In detail, the interconnection region LLR may include first to third low-k dielectric layers LK1, LK2, and LK3, which are sequentially stacked, and first and second upper interlayer insulating layers 150 and 170, which are sequentially stacked on the third low-k dielectric layer LK3. A first lower interconnection layer 131, a second lower interconnection layer 133, and a third lower interconnection layer 135 may be provided in the first low-k dielectric layer LK1, the second low-k dielectric layer LK2, and the third low-k dielectric layer LK3, respectively. However, the disclosure is not limited to this example, and the number of the low-k dielectric layers and the number of the lower interconnection layers may be variously changed.

In the disclosure, the low-k dielectric layer may be an insulating layer whose dielectric constant is lower than 4.4. For example, the first to third low-k dielectric layers LK1, LK2, and LK3 may be formed of or include SiCOH. In an embodiment, the first to third lower interconnection layers 131, 133, and 135 may be formed of or include copper (Cu) or tungsten (W). Each of the second and third lower interconnection layers 133 and 135 may include a via VI, which is formed under a bottom surface of a line-shaped structure extended in a specific direction. In each of the first to third lower interconnection layers 131, 133, and 135, an upper width may be larger than a lower width, but the disclosure is not limited to this example. In the disclosure, a width of an element may mean a length of the element measured in a direction (e.g., the second or third direction D2 or D3) parallel to the top surface of the substrate 100.

The first to third low-k dielectric layers LK1, LK2, and LK3 may be provided to have at least two different thicknesses. As an example, a thickness of the first low-k dielectric layer LK1 may be smaller than a thickness of the second low-k dielectric layer LK2 and a thickness of the third low-k dielectric layer LK3. In the disclosure, a thickness of an element may mean a length of the element measured in the fourth direction D4 that is perpendicular to the top surface of the substrate 100. The first to third low-k dielectric layers LK1, LK2, and LK3 may be formed of the same material, but the disclosure is not limited to this example; for example, the first to third low-k dielectric layers LK1, LK2, and LK3 may be formed of at least two different materials, which are different from each other in terms of their dielectric constants or chemical structure.

A portion (e.g., a first portion) of the first lower interconnection layer 131 on the cell array region CAR may be electrically connected to an upper portion of the data storage structure DSS (e.g., the top electrode TE of the capacitors) through a first lower contact 111. A portion (e.g., a second portion) of the first lower interconnection layer 131 on the peripheral circuit region PCR may be connected to one of the source/drain regions PSD of the peripheral transistors PTR through a second lower contact 113. A bottom surface of the second lower contact 113 may be located at a level lower than a bottom surface of the first lower contact 111. The first and second lower contacts 111 and 113 may have top surfaces which are located at substantially the same level. The first and second lower contacts 111 and 113 may be formed of or include at least one of tungsten (W), titanium (Ti), tantalum (Ta), and nitrides thereof. The first and second lower contacts 111 and 113 may be provided to penetrate the lower interlayer insulating layer 110.

A lower interface layer LE may be provided between the first low-k dielectric layer LK1 and the lower interlayer insulating layer 110. An upper interface layer UE may be provided between the third low-k dielectric layer LK3 and the first upper interlayer insulating layer 150. In an embodiment, the lower interface layer LE may be an interface layer, which is in contact with the lowermost one of the first to third low-k dielectric layers LK1, LK2, and LK3, and the upper interface layer UE may be an interface layer, which is in contact with the uppermost one of the first to third low-k dielectric layers LK1, LK2, and LK3. First and second intermediate interface layers ME1 and ME2 may be provided between adjacent ones of the first to third low-k dielectric layers LK1, LK2, and LK3. As an example, the first intermediate interface layer ME1 may be provided between the first low-k dielectric layer LK1 and the second low-k dielectric layer LK2, and the second intermediate interface layer ME2 may be provided between the second low-k dielectric layer LK2 and the third low-k dielectric layer LK3. At least one of the lower interface layer LE, the upper interface layer UE, and the first and second intermediate interface layers ME1 and ME2 may include a plurality of insulating layers having different properties. For example, the upper interface layer UE may include a plurality of interface layers. By contrast, the lower interface layer LE and the first and second intermediate interface layers ME1 and ME2 may have a single-layered structure. Each of the lower interface layer LE, the upper interface layer UE, and the first and second intermediate interface layers ME1 and ME2 may be formed of or include silicon nitride (SiN) or silicon carbonitride (SiCN). In an embodiment, the upper interface layer UE may be formed of or include silicon nitride (SiN), and the lower interface layer LE and the first and second intermediate interface layers ME1 and ME2 may be formed of or include silicon carbonitride (SiCN).

The first and second upper interlayer insulating layers 150 and 170 may be provided on the third low-k dielectric layer LK3. The first and second upper interlayer insulating layers 150 and 170 may have dielectric constants higher than the low-k dielectric layers LK1, LK2, and LK3. As an example, each of the first and second upper interlayer insulating layers 150 and 170 may be formed of or include a material whose dielectric constant is higher than or equal to 4.4. The first and second upper interlayer insulating layers 150 and 170 may be formed of or include alt one of borophosphosilicate glass (BPSG), tonen silazane (TOSZ), undoped silicate glass (USG), spin-on glass (SOG), flowable oxide (FOX), tetraethyl orthosilicate (TEOS), high-density-plasma chemical-vapor-deposition (HDP CVD) dielectric materials, or hydrogen silsesquioxane (HSQ).

An upper contact 151 may be provided in the first upper interlayer insulating layer 150. The upper contact 151 may be provided to penetrate the first upper interlayer insulating layer 150 and the upper interface layer UE and may be in contact with the third lower interconnection layer 135. The upper contact 151 may be electrically connected to the first to third lower interconnection layers 131, 133, and 135 and the first and second lower contacts 111 and 113. First and second upper interconnection layers 171C and 171P may be provided in the second upper interlayer insulating layer 170. The first and second upper interconnection layers 171C and 171P may be in contact with a top surface of the upper contact 151. The first upper interconnection layer 171C may be provided in the second upper interlayer insulating layer 170 on the cell array region CAR, and the second upper interconnection layer 171P may be provided in the second upper interlayer insulating layer 170 on the peripheral circuit region PCR. Each of the first and second upper interconnection layers 171C and 171P may be provided to have an upper width smaller than its lower width.

The upper contact 151 may be provided to penetrate the first upper interlayer insulating layer 150 and to connect each of the first and second upper interconnection layers 171C and 171P to the third lower interconnection layer 135. For example, the upper contact 151 may be formed of or include at least one of tungsten (W), titanium (Ti), tantalum (Ta), and nitrides thereof. The first and second upper interconnection layers 171C and 171P may be formed of or include a conductive material different from the first to third lower interconnection layers 131, 133, and 135. For example, the first to third lower interconnection layers 131, 133, and 135 may be formed of or include a first metal, and the first and second upper interconnection layers 171C and 171P may be formed of or include a second metal different from the first metal. In an embodiment, the first and second upper interconnection layers 171C and 171P may be formed of or include aluminum (Al). A first portion of the upper contact 151 may be electrically connected to the first portion of the first lower interconnection layer 131 by way of the second and third lower interconnection layers 133 and 135. A second portion of the upper contact 151 may be electrically connected to the second portion of the first lower interconnection layer 131 by way of the second and third lower interconnection layers 133 and 135.

The second upper interlayer insulating layer 170 may cover the first and second upper interconnection layers 171C and 171P. The second upper interlayer insulating layer 170 may cover top and side surfaces of each of the first and second upper interconnection layers 171C and 171P.

A barrier layer Ba may be provided to cover at least one of the first and second lower contacts 111 and 113, the first to third lower interconnection layers 131, 133, and 135, the upper contact 151, and the first and second upper interconnection layers 171C and 171P. The barrier layer Ba may be provided to cover (e.g., may extend along) bottom and side surfaces of at least one of the first and second lower contacts 111 and 113, the first to third lower interconnection layers 131, 133, and 135, the upper contact 151, and the first and second upper interconnection layers 171C and 171P. The barrier layer Ba may be formed of or include a conductive metal nitride material (e.g., titanium nitride (TiN) or tantalum nitride (TaN)). The barrier layer Ba may further contain chlorine ions, e.g., a small amount of chlorine ions.

A passivation layer 190 may be provided on the second upper interlayer insulating layer 170. In an embodiment, the passivation layer 190 may be formed of or include the same material as the upper interface layer UE. As an example, the passivation layer 190 may be formed of or include silicon nitride (SiN). In an embodiment, a density of the silicon nitride (SiN) in the passivation layer 190 may be lower than that in the upper interface layer UE. A hydrogen transmittance of the passivation layer 190 may be higher than that of the upper interface layer UE.

At least one of the first and second upper interlayer insulating layers 150 and 170 may have a high hydrogen concentration and a high hydrogen supplying ability. As an example, the second upper interlayer insulating layer 170 may have a higher hydrogen concentration and a better hydrogen supplying ability than the first upper interlayer insulating layer 150. In an embodiment, the first upper interlayer insulating layer 150 may be a TEOS layer, which is formed of or includes tetraethyl orthosilicate (TEOS), and the second upper interlayer insulating layer 170 may be a HDP layer, which is formed of or includes a high-density-plasma CVD dielectric material. Alternatively, both of the first and second upper interlayer insulating layers 150 and 170 may be the HDP layers. In an embodiment, the second upper interlayer insulating layer 170 may be the TEOS layer, and the first upper interlayer insulating layer 150 may be the HDP layer. In the disclosure, the hydrogen may be a hydrogen ion, a hydrogen atom, or a hydrogen molecule.

According to an embodiment of the disclosure, the second upper interlayer insulating layer 170 in the interconnection region LLR may be configured to supply the hydrogen to the cell array region CAR in an alloy process, which will be described below. As an example, the hydrogen may be supplied to the cell array region CAR from the second upper interlayer insulating layer 170 through a hydrogen supply path 5 passing through the first upper interconnection layer 171C, the upper contact 151, the first to third lower interconnection layers 131, 133, and 135, and the first lower contact 111. As another example, the hydrogen may be supplied to the peripheral circuit region PCR from the second upper interlayer insulating layer 170 through the hydrogen supply path 5 passing through the second upper interconnection layer 171P, the upper contact 151, the first to third lower interconnection layers 131, 133, and 135, and the second lower contact 113. However, the illustrated hydrogen supply path 5 may be just one example, and the hydrogen may be supplied through various paths passing through the first lower contact 111, the first to third lower interconnection layers 131, 133, and 135, the upper contact 151, and the first and second upper interconnection layers 171C and 171P.

The blocking layer BLL and the first lower contact 111 will be described in more detail with reference to FIG. 3.

Referring to FIG. 3, the first lower contact 111 may be provided to penetrate the auxiliary electrode AUE and may be in contact with the blocking layer BLL. The first lower contact 111 may be spaced apart from the top electrode TE in the fourth direction D4. Above the top surface of the top electrode TE, a bottom surface of the first lower contact 111 may be located at a first level LV1. Above the top surface of the top electrode TE, a top surface of the blocking layer BLL may be located at a second level LV2. On the top surface of the top electrode TE, a bottom surface of the blocking layer BLL may be located at a third level LV3. The first level LV1 may be positioned between the second level LV2 and the third level LV3.

Since the first level LV1 is located between the second level LV2 and the third level LV3, a contact area between the barrier layer Ba and the blocking layer BLL may be increased. In addition, the barrier layer Ba may not be in contact with the top electrode TE. Accordingly, it may be possible to improve the chlorine ion blocking ability and the hydrogen storing ability of the blocking layer BLL. Since the hydrogen storing ability of the blocking layer BLL is improved, the hydrogen supply paths may be diversified, and this may make it possible to improve the hydrogen supplying ability of the blocking layer BLL. The chlorine ion blocking ability, the hydrogen storing ability, and the hydrogen supplying ability of the blocking layer BLL will be described in more detail below.

A bottom surface of the barrier layer Ba of the first lower contact 111 may be in contact with the blocking layer BLL. A side surface of the barrier layer Ba of the first lower contact 111 may be in contact with the auxiliary electrode AUE and the blocking layer BLL. At least a portion of a side surface of the first lower contact 111 may be in contact with the blocking layer BLL and the auxiliary electrode AUE.

A thickness of the auxiliary electrode AUE may be a first thickness T1. A thickness of the blocking layer BLL may be a second thickness T2. As an example, the first thickness T1 may be smaller than the second thickness T2. As another example, the first thickness T1 may be substantially equal to or larger than the second thickness T2.

The barrier layer Ba of the first lower contact 111 may contain chlorine (Cl) ions. The blocking layer BLL may prevent the chlorine ions from being moved in a direction toward the data storage structure DSS and the first active regions ACT1 on the substrate 100. Since the chlorine ions in the barrier layer Ba are blocked by the blocking layer BLL, the chlorine ions may not be moved toward the first active regions ACT1 through the data storage structure DSS and may be left in the blocking layer BLL. Thus, a chlorine concentration of the blocking layer BLL may be higher than those in other layers (e.g., the top electrode TE, the auxiliary electrode AUE, and so forth).

In addition, hydrogen atoms may be stored in the blocking layer BLL. As will be described below, hydrogen atoms in the first and second upper interlayer insulating layers 150 and 170 may be moved along the hydrogen supply path 5, in a process of forming the first and second upper interlayer insulating layers 150 and 170. During this process, the hydrogen atoms may be stored in the blocking layer BLL. For example, the moving hydrogen atoms may be combined with silicon atoms in the blocking layer BLL and consequently may be stored in the blocking layer BLL. In a subsequent alloy process, the hydrogen atoms stored in the blocking layer BLL may be moved along an additional hydrogen supply path 7 in a direction toward the first active regions ACT1.

The supply of hydrogen atoms to the cell array region CAR may prevent reduction in data retention time as follows.

Dangling bonds may be formed on a gate insulating layer enclosing the word line WL, and in this case, a leakage current may be increased to deteriorate electric characteristics of the semiconductor device. In the case of the semiconductor device, such as a DRAM device, it is necessary to perform a refresh operation of rewriting existing data every predetermined period. Here, the period may be called refresh period or data retention time. For the DRAM device, in order to reduce a power consumption and increase an operation speed, it may be necessary to increase the data retention time. However, if there is a structural defect, such as the dangling bond, in a silicon crystal, a leakage current in a transistor may be increased and the data retention time may be reduced.

The hydrogen atoms, which are supplied to the cell array region CAR, may supply electrons to the dangling bonds. Accordingly, the leakage current may be reduced, and it may be possible to prevent or suppress the data retention time from being reduced.

According to an embodiment, the blocking layer BLL may be provided on the top surface of the top electrode TE. The blocking layer BLL may prevent chlorine ions, which are present in the barrier layer Ba of the first lower contact 111, from being moved toward the first active regions ACT1. In the case where the chlorine ions are supplied to the cell array region CAR, the chlorine ions may be combined with the dangling bonds, and this may lead to a difficulty in supplying the electrons to the dangling bonds through the hydrogen atoms. However, according to an embodiment, since the blocking layer BLL suppresses the movement of the chlorine ions, the above problem may be prevented.

Furthermore, in an alloy process, the hydrogen atoms stored in the blocking layer BLL may be moved toward the first active regions ACT1 along the additional hydrogen supply path 7. That is, in addition to the hydrogen supply path 5, a large amount of hydrogen atoms may be additionally supplied by the blocking layer BLL. Accordingly, it may be possible to effectively reduce structural defects (e.g., the dangling bonds).

If the chlorine ions move to the dielectric layer DL and chemically react with the dielectric layer DL, a leakage current in the data storage structure DSS may be increased. However, according to an embodiment, since the movement of the chlorine ions is prevented by the blocking layer BLL, it may be possible to reduce the leakage current in the data storage structure DSS. As a result, it may be possible to improve electric characteristics of the semiconductor device.

FIGS. 4 to 9 are sectional views taken along the line I-I' of FIG. 1 to illustrate a method of fabricating a semiconductor device, according to an embodiment.

Figure 4:
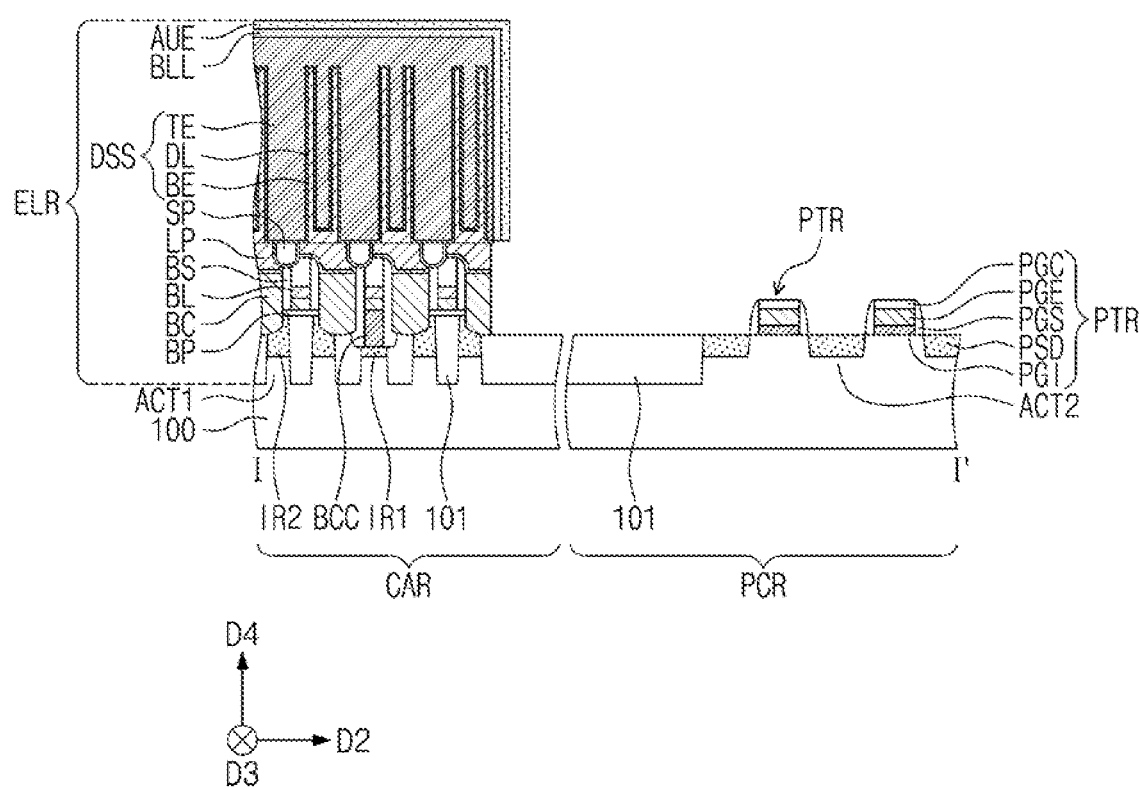
FIGS. 4 to 9 are sectional views taken along the line I-I' of FIG. 1 to illustrate a method of fabricating a semiconductor device, according to an embodiment.

Referring to FIG. 4, the integrated circuit region ELR may be formed. The formation of the integrated circuit region ELR may include forming the device isolation layer 101 in the cell array region CAR to form the first active regions ACT1 in an upper portion of the substrate 100, forming the word lines WL, forming the first and second impurity regions IR1 and IR2 in upper portions of the first active regions ACT1, forming the bit line contacts BCC connected to the first impurity regions IR1, forming the bit lines BL, forming the node contacts BC connected to the second impurity regions IR2, and forming the data storage structure DSS on the node contacts BC. The formation of the data storage structure DSS may include sequentially forming the bottom electrode BE, which is connected to the node contacts BC, the dielectric layer DL, and the top electrode TE.

The blocking layer BLL may be formed on the data storage structure DSS. In detail, the blocking layer BLL may be conformally formed on the top electrode TE of the data storage structure DSS. The blocking layer BLL may be formed of or include at least one of silicon-based materials and silicon-nitride-based materials. For example, the blocking layer BLL may be formed of or include at least one of silicon (Si), silicon germanium (SiGe), silicon nitride (SiN), silicon oxynitride (SiON), silicon carbonitride (SiCN), silicon boron nitride (SiBN), and carbon- and nitride-included silicon oxide (SiCON). The blocking layer BLL may be formed by a chemical vapor deposition method or a diffusion process. The blocking layer BLL may be extended along the top and side surfaces (e.g., at least one side surface) of the top electrode TE.

The auxiliary electrode AUE may be conformally formed on the blocking layer BLL. The auxiliary electrode AUE may be formed of or include the same material as the top electrode TE. As an example, the auxiliary electrode AUE may be formed of or include silicon-germanium doped with impurities. The auxiliary electrode AUE may be formed by a chemical vapor deposition method or by a diffusion process. The auxiliary electrode AUE may be extended along the top and side surfaces (e.g., at least one side surface) of the top electrode TE.

The formation of the integrated circuit region ELR may include forming the device isolation layer 101 in an upper portion of the substrate 100 to define the second active region ACT2 in the peripheral circuit region PCR and forming a plurality of the peripheral transistors PTR on the second active region ACT2.

Figure 5:
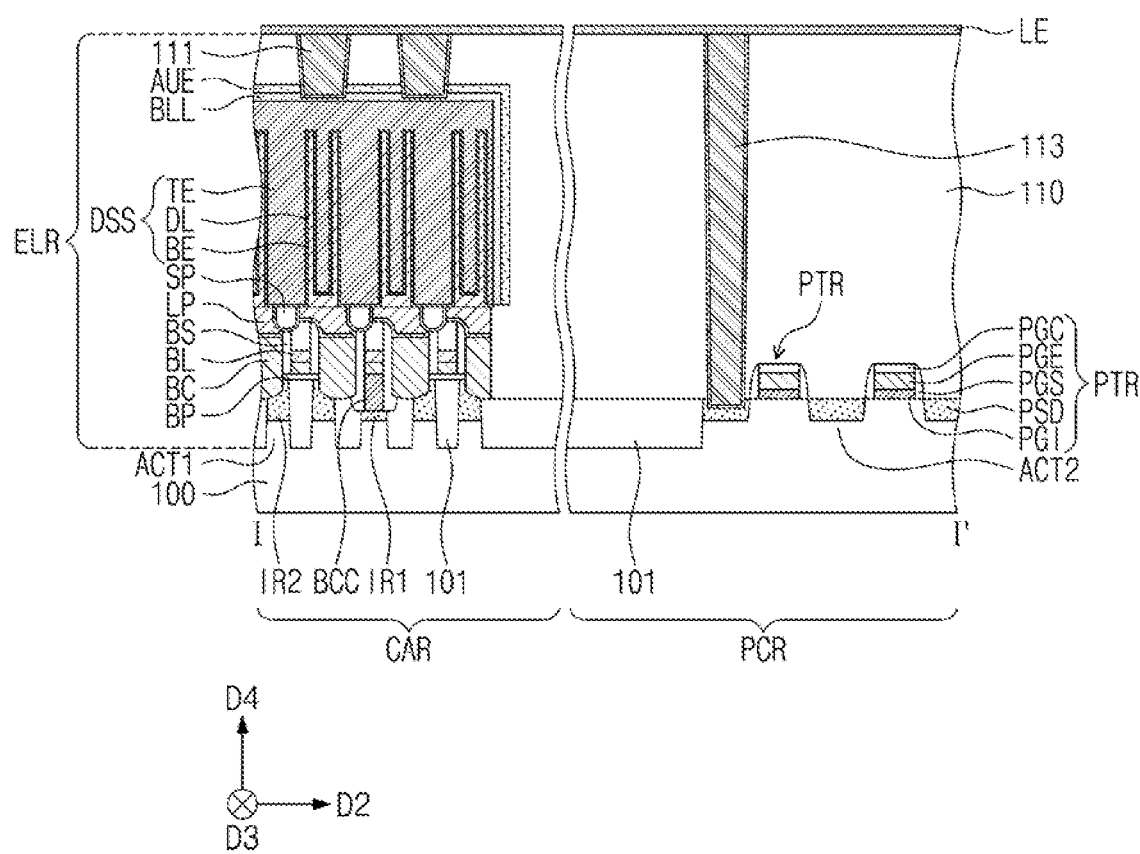

Referring to FIG. 5, the lower interlayer insulating layer 110 may be formed to cover the data storage structure DSS on the cell array region CAR and the peripheral transistors PTR on the peripheral circuit region PCR. The lower interlayer insulating layer 110 may cover the blocking layer BLL and the auxiliary electrode AUE. Contact holes may be formed to penetrate at least a portion of the lower interlayer insulating layer 110, and then, the first and second lower contacts 111 and 113 may be formed in the contact holes. In an embodiment, the contact hole in the integrated circuit region ELR on the cell array region CAR may be formed to expose the blocking layer BLL, and thus, the first lower contact 111 may be connected to the blocking layer BLL on the cell array region CAR. The first lower contact 111 may be electrically connected to the data storage structure DSS through the blocking layer BLL. In addition, the contact hole in the integrated circuit region ELR on the peripheral circuit region PCR may be formed to expose one of the source/drain regions PSD of the peripheral transistors PTR, and thus, the second lower contact 113 may be connected to one of the source/drain regions PSD. The first and second lower contacts 111 and 113 may be formed by performing a deposition process (e.g., a sputtering or MOCVD process) and performing a planarization process (e.g., a chemical mechanical polishing (CMP) process) after the deposition process.

A top surface of the lower interlayer insulating layer 110 may be exposed through the planarization process. In an embodiment, a surface treatment process may be performed on the lower interlayer insulating layer 110 exposed by the planarization process. For example, the surface treatment process may be performed through at least one of a gas treatment process, in which at least one of $NH_3$, $H_2$, Ar, $N_2$, and $SiH_4$ is used, a direct or remote plasma treatment process, and a UV treatment process. After the surface treatment process, the lower interface layer LE may be formed on the lower interlayer insulating layer 110.

Figure 6:
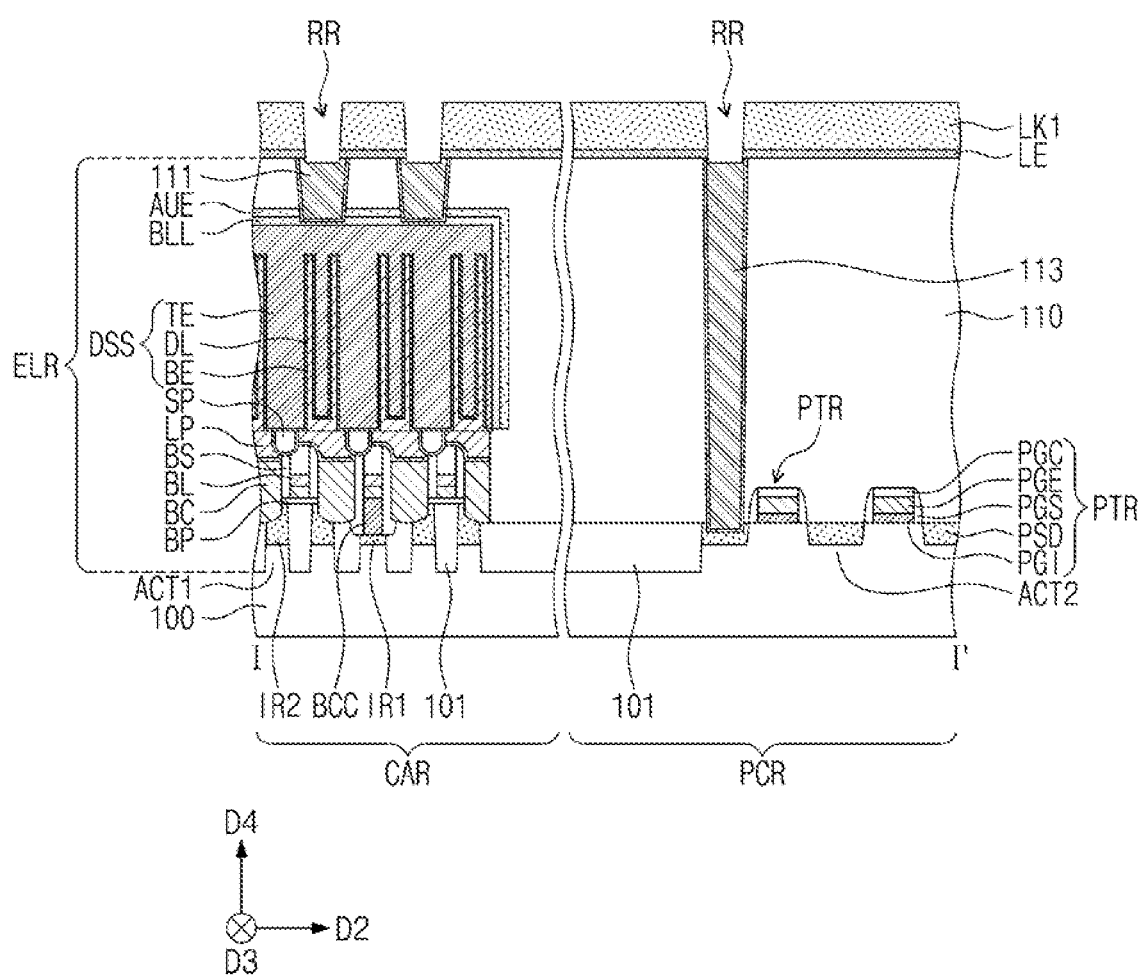

Referring to FIG. 6, the first low-k dielectric layer LK1 may be formed on the lower interface layer LE. In an embodiment, the first low-k dielectric layer LK1 may be formed of or include SiCOH. A mask pattern may be formed on the first low-k dielectric layer LK1, and then, an etching process may be performed to expose the first and second lower contacts 111 and 113. In an embodiment, the first and second lower contacts 111 and 113 may be partially etched, during the etching process. During the etching process, the lower interface layer LE may be used as an etch stop layer. Recess regions RR may be formed in the first low-k dielectric layer LK1. Each of the recess regions RR may be an empty region, which is defined by the top surfaces of the first and second lower contacts 111 and 113, the side surface of the lower interface layer LE, and the side surface of the first low-k dielectric layer LK1. The etching process may be performed through a dry and/or wet etching process.

Figure 7:
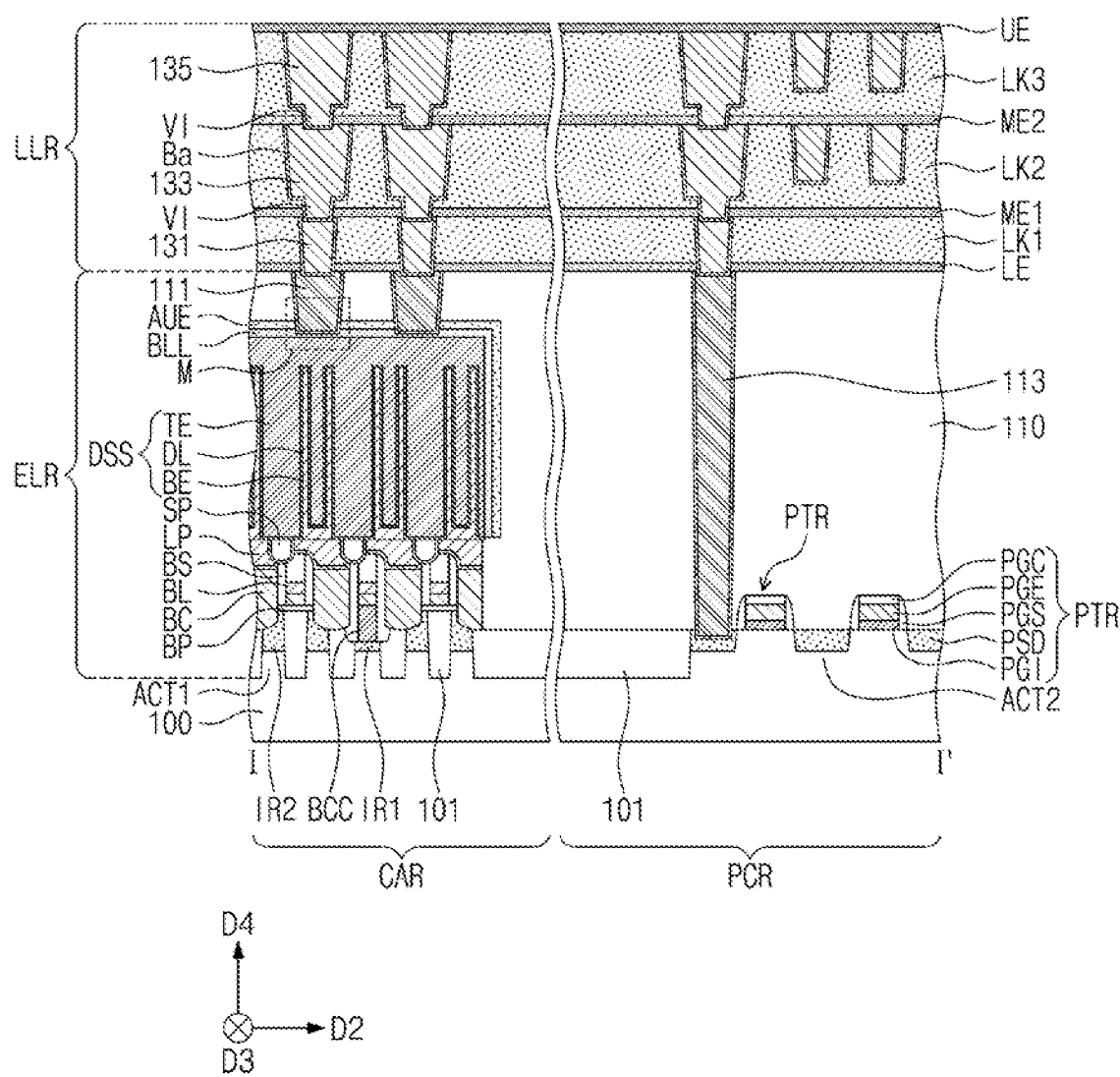

Referring to FIG. 7, the first lower interconnection layer 131 may be formed to fill the recess regions RR. As an example, the first lower interconnection layer 131 may be formed by a damascene process using copper (Cu) or tungsten (W). Thereafter, the damascene process may be repeatedly performed to form the second and third lower interconnection layers 133 and 135. At least one of the first to third lower interconnection layers 131, 133, and 135 may be formed by a dual damascene process. As a result of the damascene process, each of the first to third lower interconnection layers 131, 133, and 135 may be formed to have an upper width larger than a lower width.

The upper interface layer UE may be formed to cover the third lower interconnection layer 135. The upper interface layer UE and the first and second intermediate interface layers ME1 and ME2 therebelow may be formed in the same or similar manner as the method of forming the lower interface layer LE described above. Accordingly, a portion of the interconnection region LLR may be formed on the integrated circuit region ELR.

Figure 8:
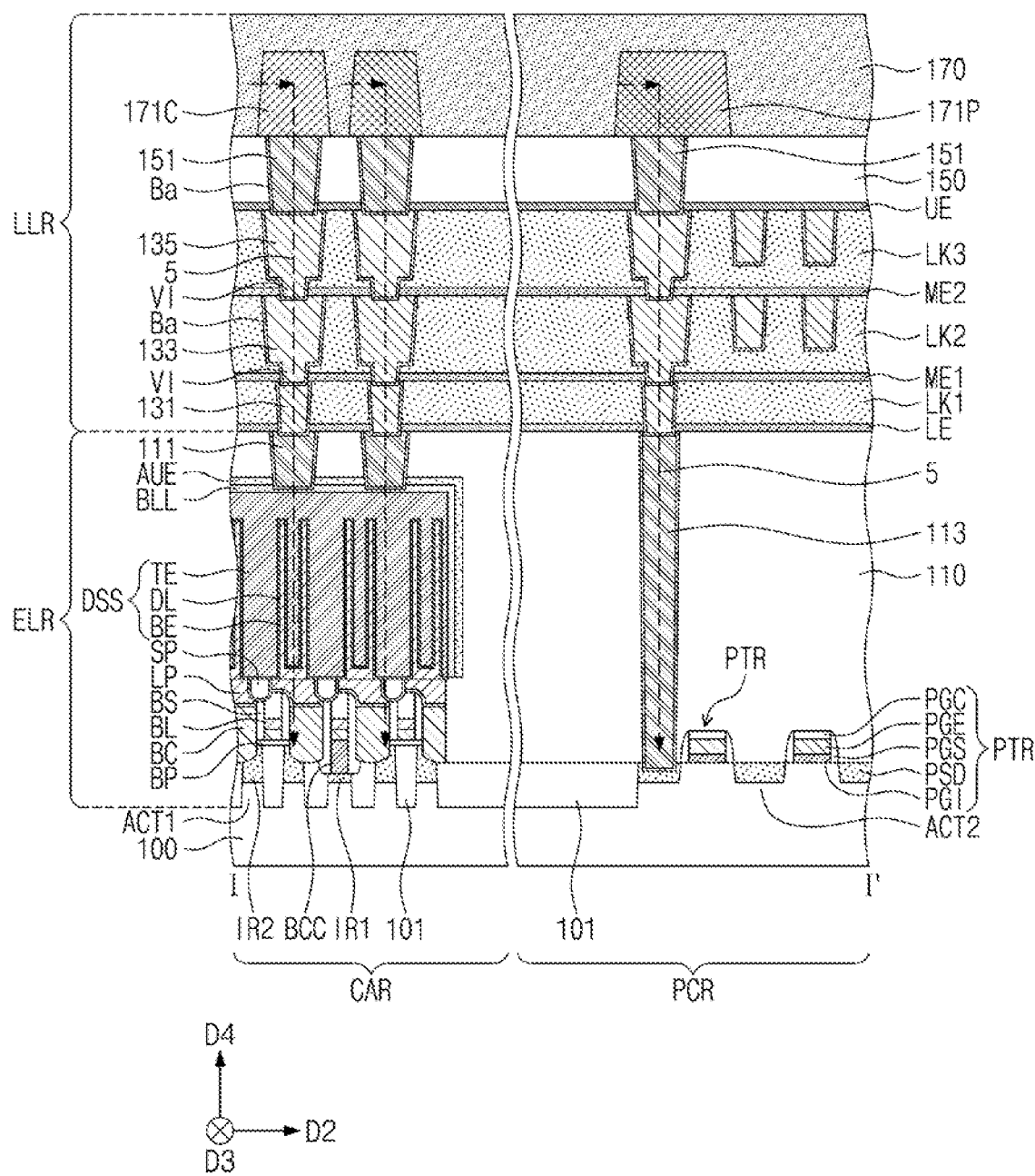

Referring to FIG. 8, the first upper interlayer insulating layer 150 may be formed on the upper interface layer UE. Next, a mask pattern may be formed on the first upper interlayer insulating layer 150, and then, an etching process may be performed to expose the third lower interconnection layer 135. In an embodiment, a portion of the third lower interconnection layer 135 may be etched during the etching process. After the etching process, a deposition process and a planarization process may be performed to form the upper contact 151. The upper contact 151 may be formed to penetrate the upper interface layer UE and to be in contact with the third lower interconnection layer 135. The upper contact 151 may be formed in the same or similar manner as the method of forming the first and second lower contacts 111 and 113 described above.

The first and second upper interconnection layers 171C and 171P may be formed on the first upper interlayer insulating layer 150 and the upper contact 151. In detail, the first upper interconnection layer 171C may be formed on the cell array region CAR and may be electrically connected to the data storage structure DSS on the cell array region CAR. The second upper interconnection layer 171P may be formed on the peripheral circuit region PCR and may be electrically connected to one of the peripheral transistors PTR on the peripheral circuit region PCR. In an embodiment, the first and second upper interconnection layers 171C and 171P may be formed by forming a conductive layer (e.g., an aluminum (Al) layer) and patterning the conductive layer. As an example, the patterning of the conductive layer may be performed through a reactive ion etching (RIE) process.

The second upper interlayer insulating layer 170 may be formed to cover the first upper interlayer insulating layer 150 and the first and second upper interconnection layers 171C and 171P. The second upper interlayer insulating layer 170 may directly cover a portion of the top surface of the first upper interlayer insulating layer 150, on the peripheral circuit region PCR.

At least one of the first and second upper interlayer insulating layers 150 and 170 may have a high hydrogen concentration and a high hydrogen supplying ability. In a process of forming the first and second upper interlayer insulating layers 150 and 170, hydrogen atoms may be supplied to the cell array region CAR through the hydrogen supply path 5. Here, some of the moving hydrogen atoms may be combined with silicon atoms in the blocking layer BLL and may be stored in the blocking layer BLL.

Figure 9:
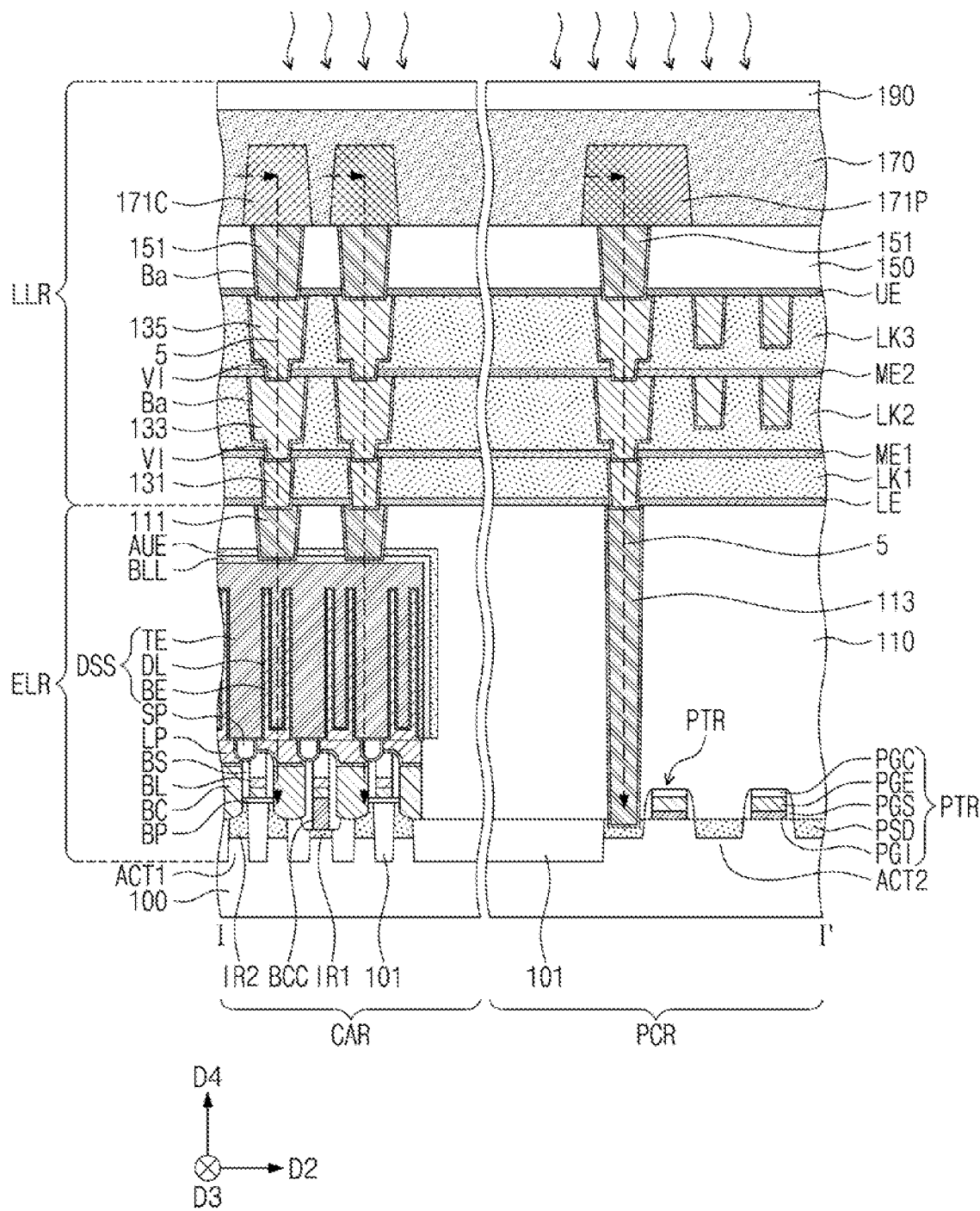

Referring to FIG. 9, the passivation layer 190 may be formed on the second upper interlayer insulating layer 170. The second upper interlayer insulating layer 170 and the passivation layer 190 may be formed on both of the cell array region CAR and the peripheral circuit region PCR.

Thereafter, an alloy process may be performed. For example, the alloy process may be performed at a temperature of about 300° C. to 500° C. for several tens to several hundreds of minutes. Heat in the alloy process may be applied to the passivation layer 190 and may be supplied through the hydrogen supply path 5. The passivation layer 190 may prevent hydrogen atoms from being moved in an opposite direction of the hydrogen supply path 5, during the alloy process.

During the alloy process, hydrogen atoms in the second upper interlayer insulating layer 170 may be supplied to the cell array region CAR through the first upper interconnection layer 171C, the upper contact 151, the first to third lower interconnection layers 131, 133, and 135, and the first lower contact 111. In other words, hydrogen atoms of the second upper interlayer insulating layer 170 may be delivered to the first active regions ACT1 on the substrate 100 through the hydrogen supply path 5.

In addition, as described with reference to FIG. 3, hydrogen atoms, which are stored in the blocking layer BLL, may be supplied to the cell array region CAR through the additional hydrogen supply path 7.

Figure 10:
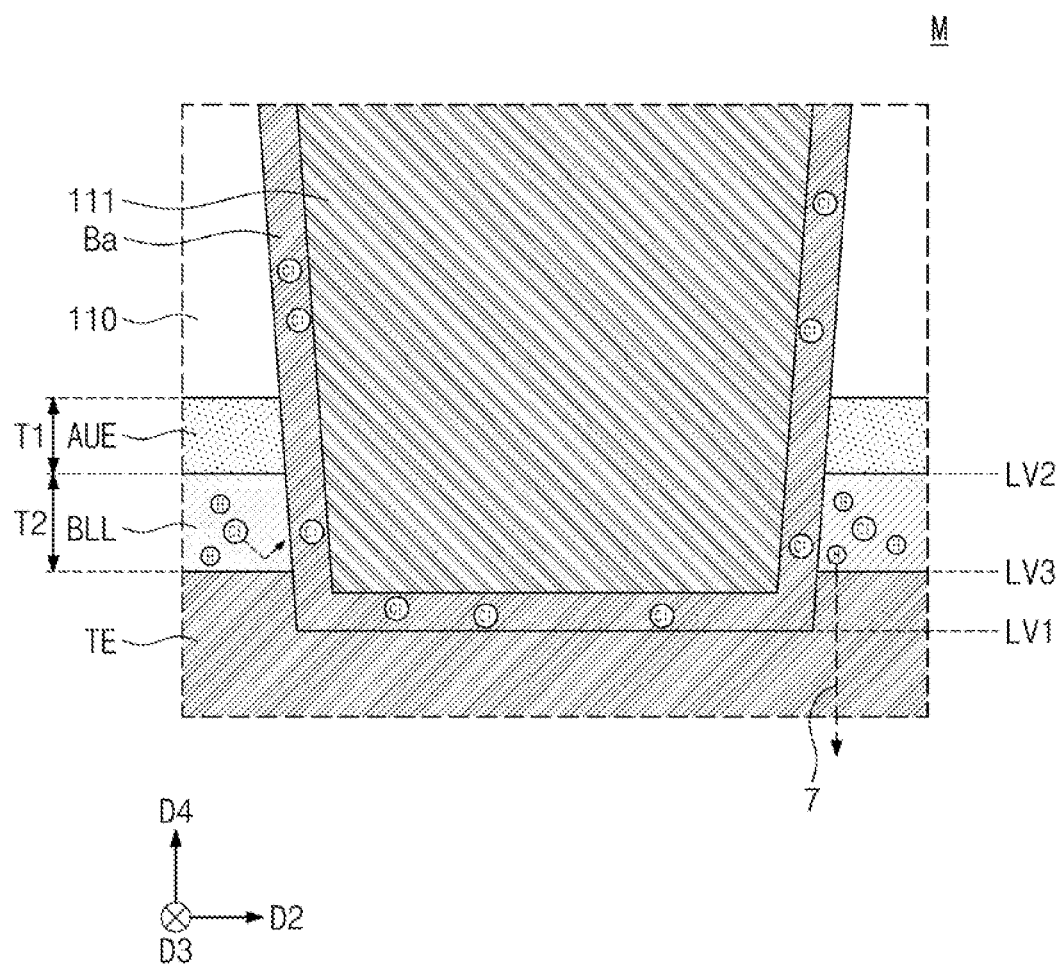
FIG. 10 is an enlarged sectional view illustrating a portion (e.g., 'M' of FIG. 2) of a semiconductor device according to an embodiment.

FIG. 10 is an enlarged sectional view illustrating a portion (e.g., 'M' of FIG. 2) of a semiconductor device according to an embodiment. In the following description, an element previously described with reference to FIGS. 1 to 3 may be identified by the same reference number without repeating an overlapping description thereof, for concise description.

Referring to FIG. 10, the first lower contact 111 may be provided to penetrate the auxiliary electrode AUE and the blocking layer BLL and to be in contact with the top electrode TE. The first level LV1 may be lower than the third level LV3. In other words, the first lower contact may penetrate an entire depth of the blocking layer BLL and may partially extend into the top electrode TE.

Figure 11:
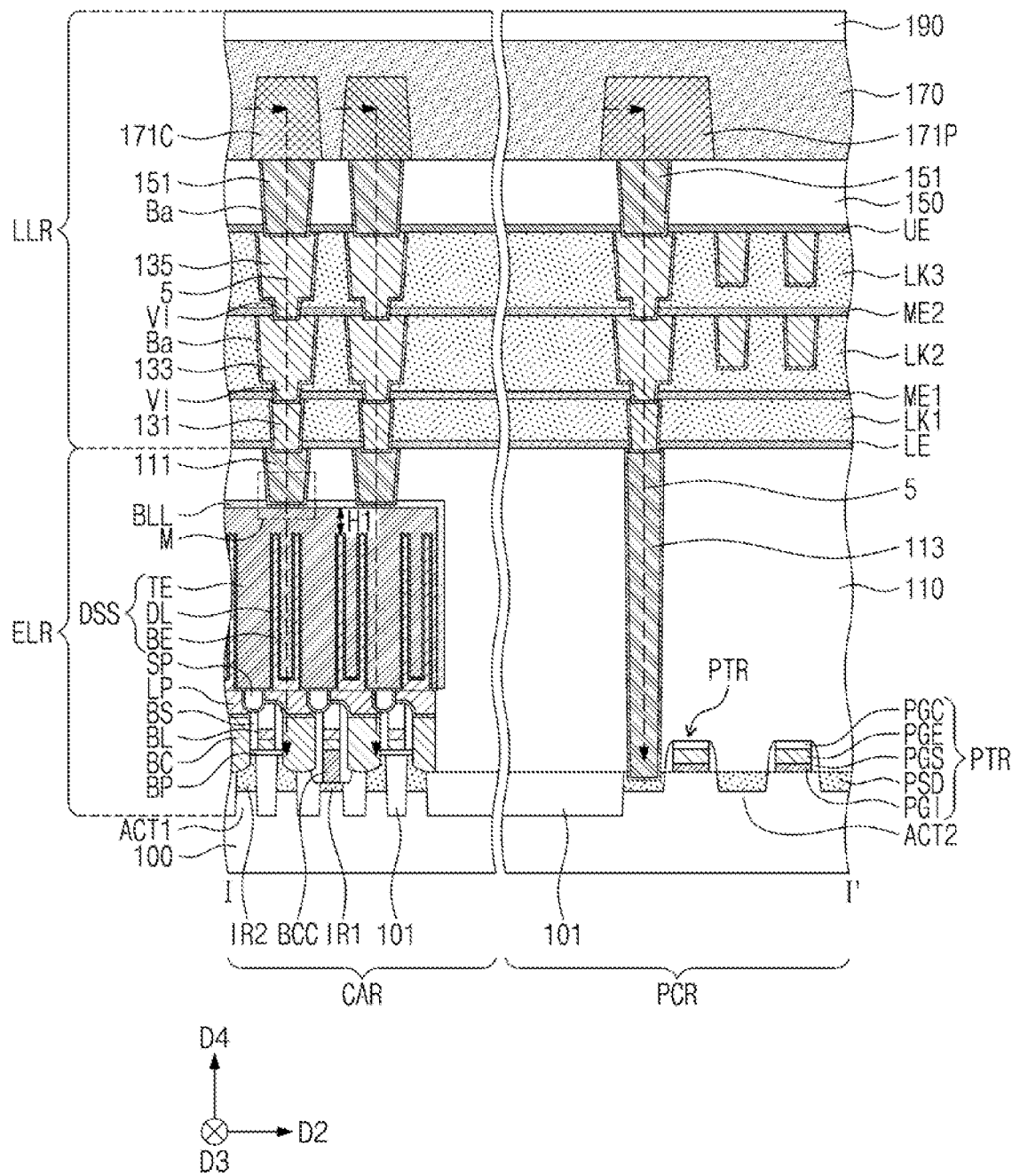
FIG. 11 is a sectional view taken along the line I-I' of FIG. 1 to illustrate a semiconductor device according to an embodiment.
Figure 12:
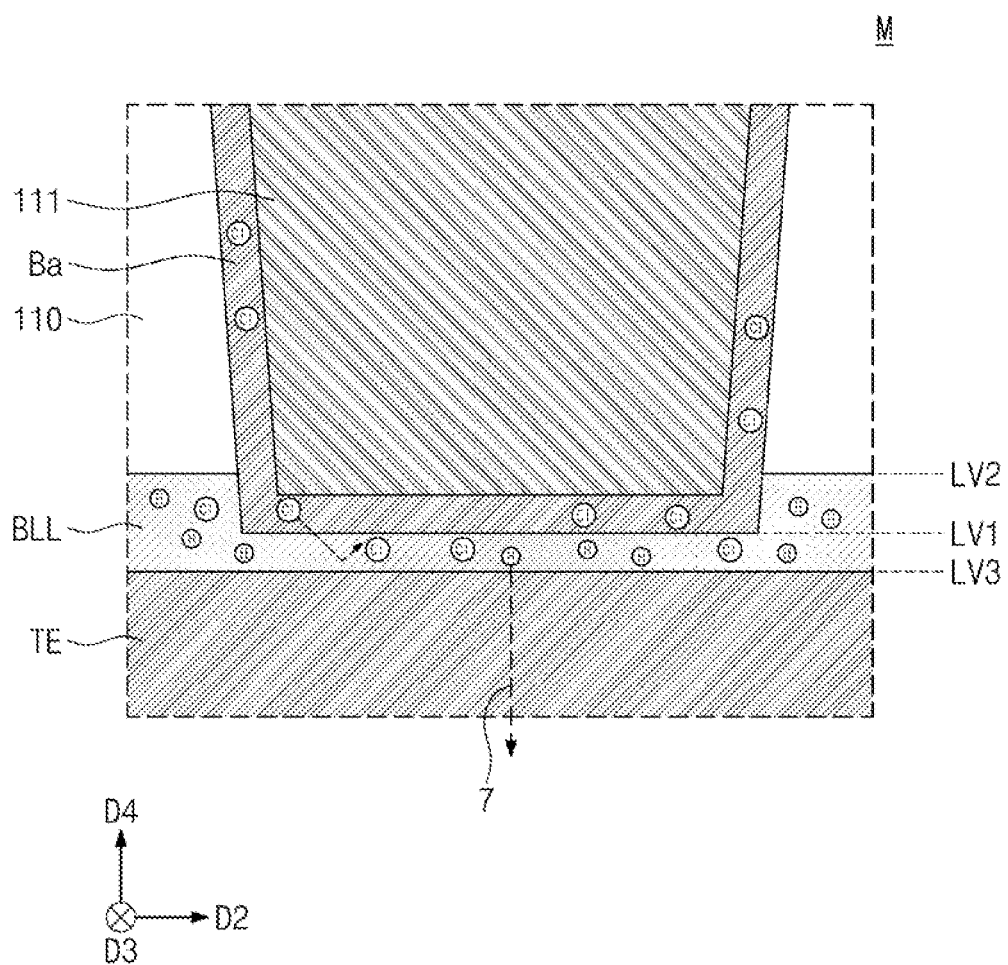
FIGS. 12 and 13 are enlarged sectional views, each of which illustrates a portion 'M' of FIG. 11.
Figure 13:
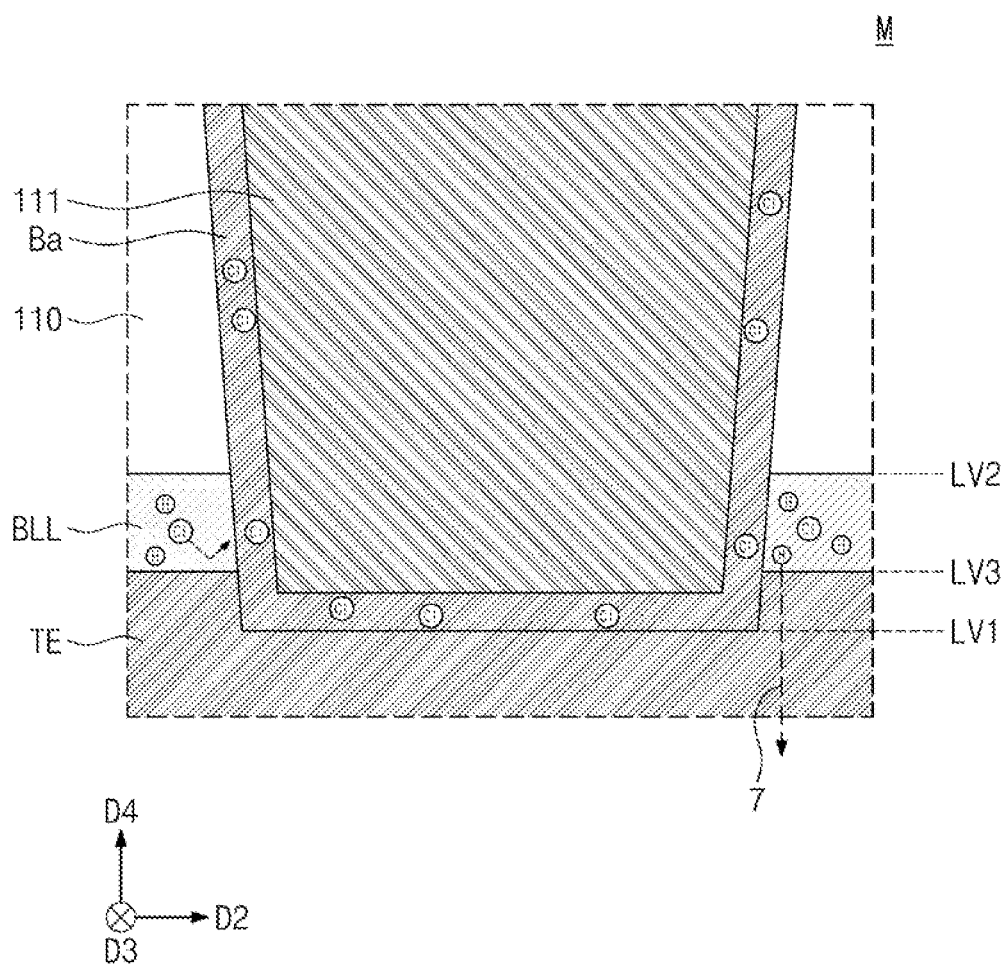

FIG. 11 is a sectional view taken along the line I-I' of FIG. 1 to illustrate a semiconductor device according to an embodiment. FIGS. 12 and 13 are enlarged sectional views, each of which illustrates a portion 'M' of FIG. 11. In the following description, an element previously described with reference to FIGS. 1 to 3 may be identified by the same reference number without repeating an overlapping description thereof, for concise description.

Referring to FIG. 11, the auxiliary electrode AUE may be omitted, unlike that described with reference to FIGS. 1 to 3. The first lower contact 111 may be in contact with the blocking layer BLL.

Referring to FIG. 12, the first level LV1 may be positioned between the second level LV2 and the third level LV3.

Referring to FIG. 13, the first lower contact 111 may be provided to penetrate the blocking layer BLL and may be in contact with the top electrode TE. As shown, e.g., in FIG. 13, the first level LV1 may be lower than the third level LV3.

Figure 14:
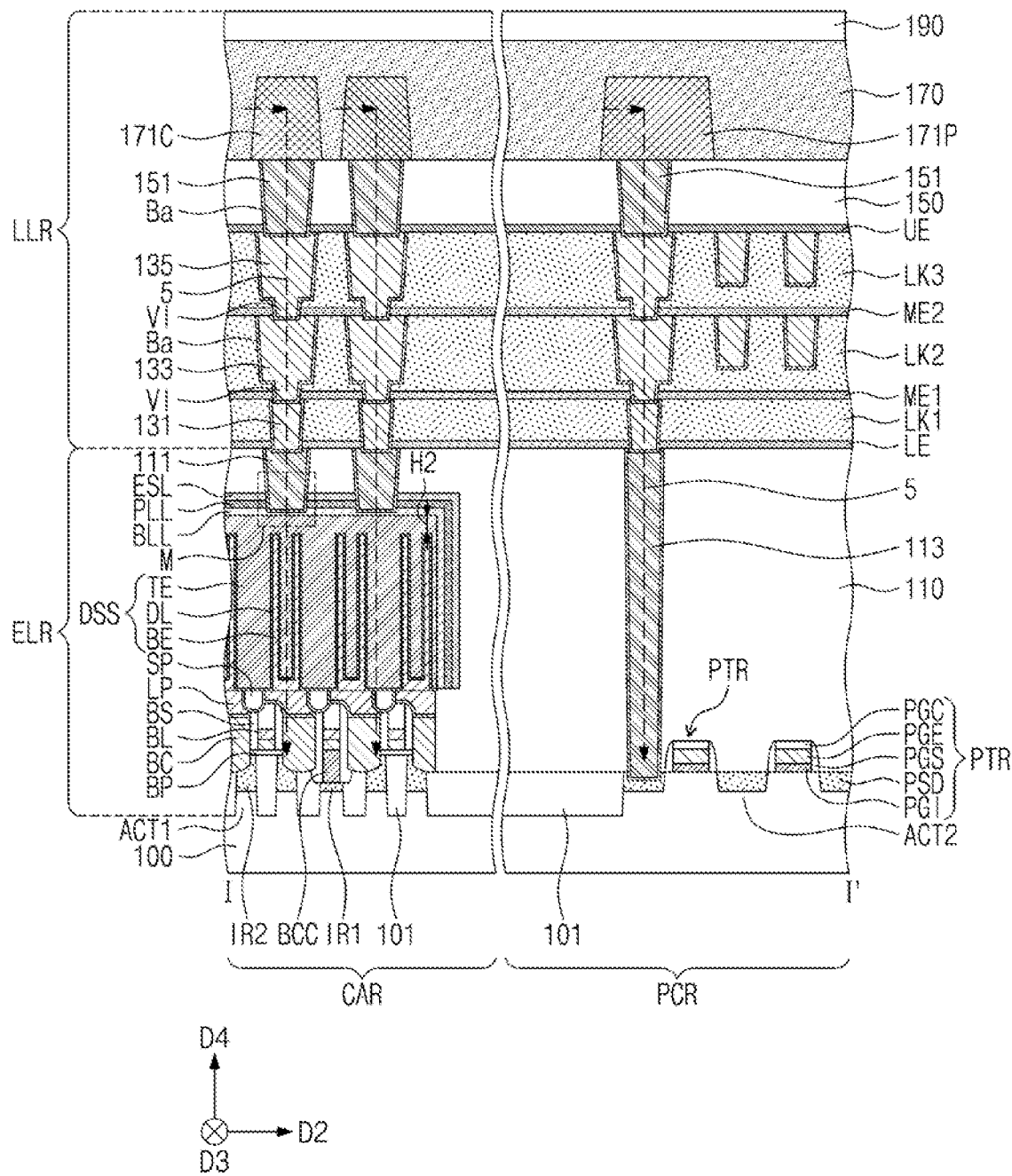
FIG. 14 is a sectional view taken along the line I-I' of FIG. 1 to illustrate a semiconductor device according to an embodiment.
Figure 15:
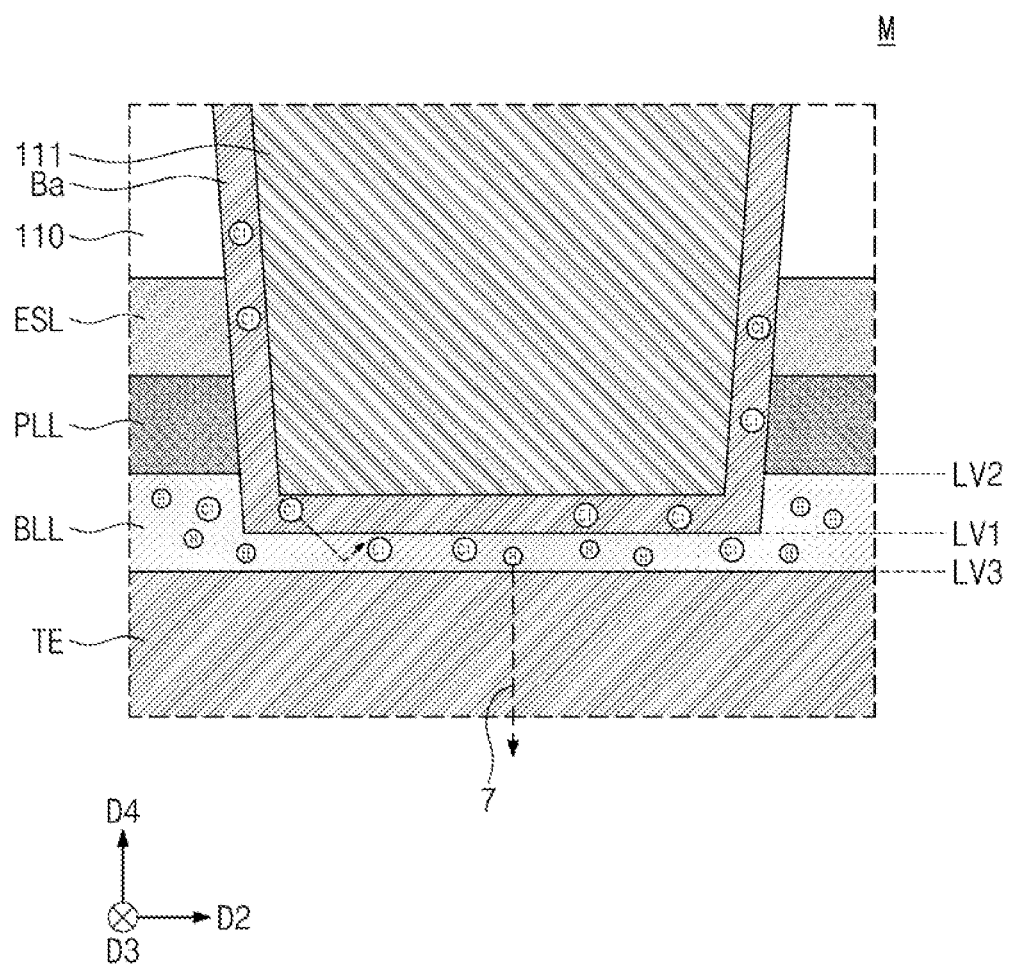
FIGS. 15 to 17 are enlarged sectional views, each of which illustrates a portion 'M' of FIG. 14.
Figure 16:
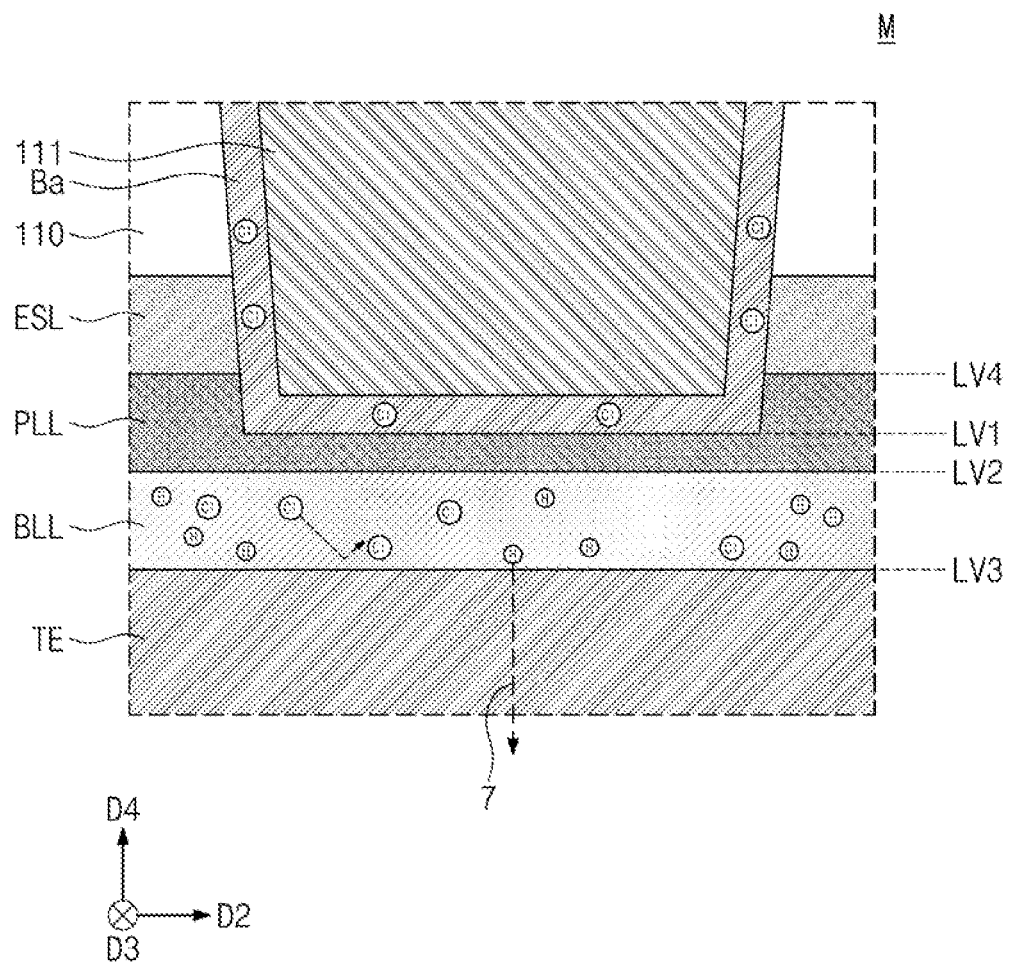
Figure 17:
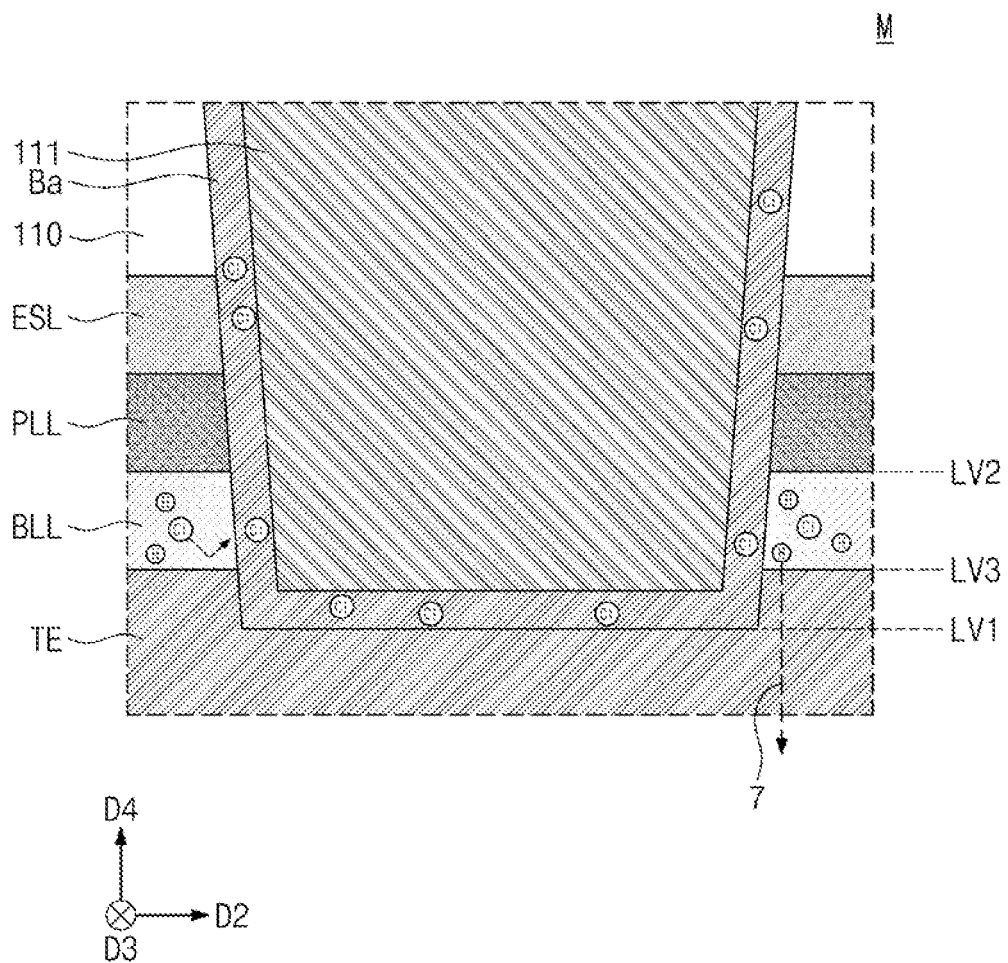

FIG. 14 is a sectional view taken along the line I-I' of FIG. 1 to illustrate a semiconductor device according to an embodiment. FIGS. 15 to 17 are enlarged sectional views, each of which illustrates a portion 'M' of FIG. 14. In the following description, an element previously described with reference to FIGS. 1 to 3 may be identified by the same reference number without repeating an overlapping description thereof, for concise description.

Referring to FIG. 14, the blocking layer BLL may be conformally provided on the top surface of the top electrode TE. A metal layer PLL may be conformally provided on the blocking layer BLL. In an embodiment, the metal layer PLL may be formed of or include tungsten (W). The metal layer PLL may be extended along the top and side surfaces (e.g., at least one side surface) of the top electrode TE. An etch stop layer ESL may be conformally provided on the metal layer PLL. The etch stop layer ESL may be extended along the top and side surfaces (e.g., at least one side surface) of the top electrode TE.

A vertical distance from the blocking layer BLL, which is provided on the top surface of the top electrode TE, to the dielectric layer DL may be a second distance H2. The second distance H2 may be smaller than the first distance H1 described with reference to FIG. 2.

If the metal layer PLL is provided, it may be possible to reduce a contact resistance, compared with the case that the metal layer PLL is omitted and only the blocking layer BLL is provided. In addition, it may be possible to form the top electrode TE containing boron atoms to a relatively thin thickness and thereby to reduce a boron content in the semiconductor device. This may make it possible to reduce aviation failures that may occur during cross-border movement (e.g., import and export) of the semiconductor device.

Referring to FIG. 15, the first lower contact 111 may be provided to penetrate the etch stop layer ESL and the metal layer PLL and to be in contact with the blocking layer BLL. The first level LV1 may be positioned between the second level LV2 and the third level LV3.

Referring to FIG. 16, the first lower contact 111 may be provided to penetrate the etch stop layer ESL and to be in contact with the metal layer PLL. A bottom surface of the metal layer PLL may be positioned at the second level LV2. Above the top surface of the top electrode TE, a top surface of the metal layer PLL may be located at a fourth level LV4. The first level LV1 may be positioned between the second level LV2 and the fourth level LV4. The first lower contact 111 may be spaced apart from the blocking layer BLL in the fourth direction D4.

Referring to FIG. 17, the first lower contact 111 may be provided to penetrate the etch stop layer ESL, the metal layer PLL, and the blocking layer BLL and to be in contact with the top electrode TE. The first level LV1 may be lower than the third level LV3.

Figure 18:
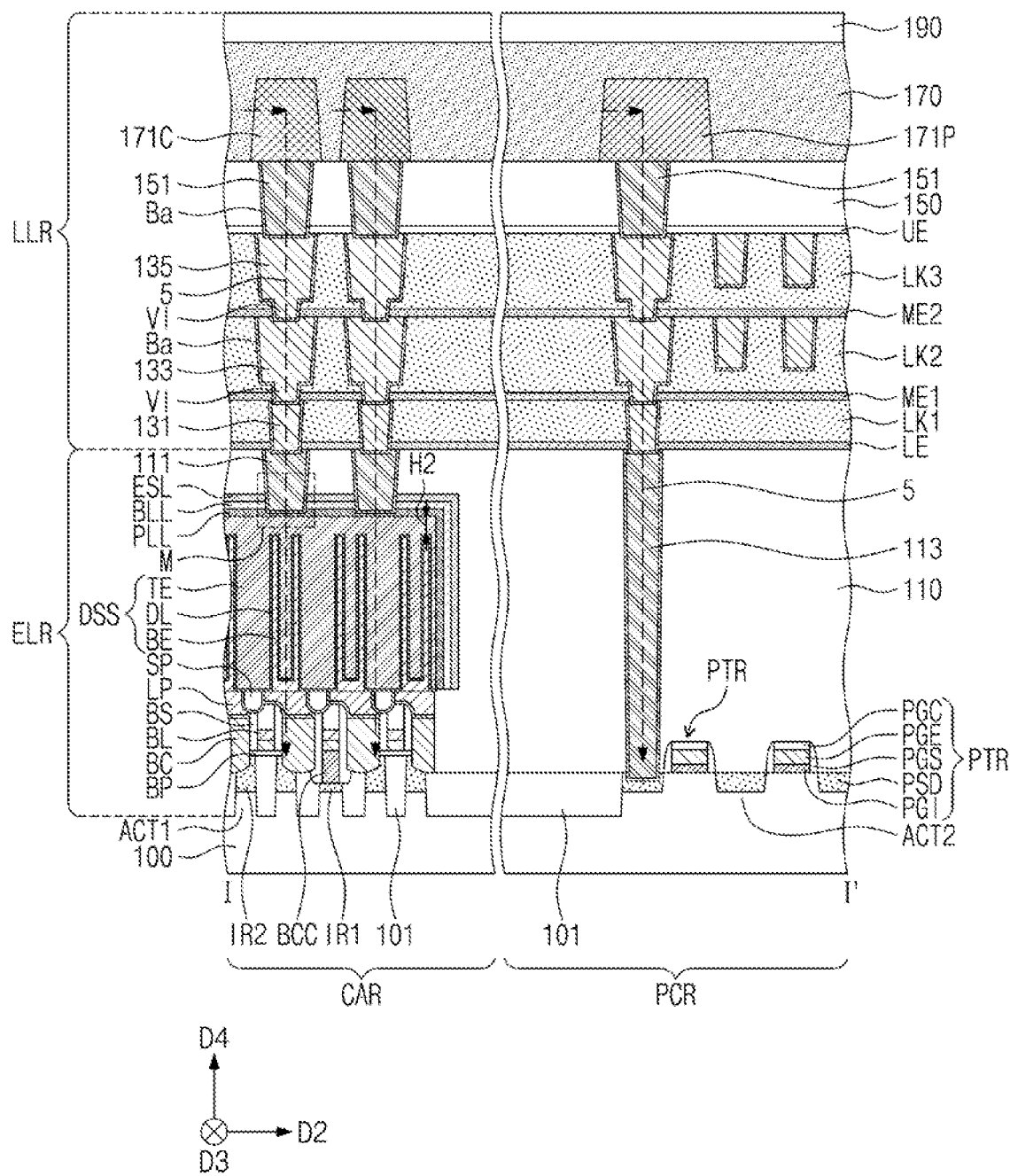
FIG. 18 is a sectional view taken along the line I-I' of FIG. 1 to illustrate a semiconductor device according to an embodiment.
Figure 19:
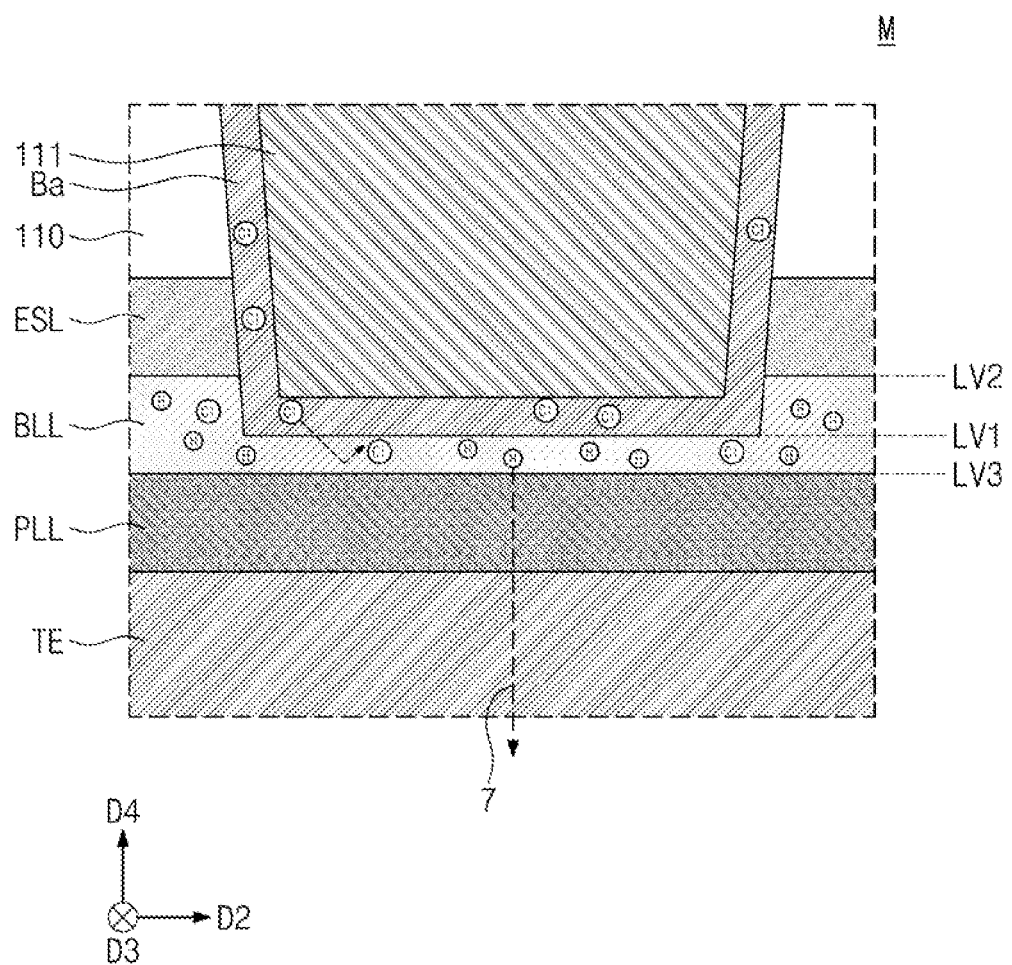
FIGS. 19 to 21 are enlarged sectional views, each of which illustrates a portion 'M' of FIG. 18.
Figure 20:
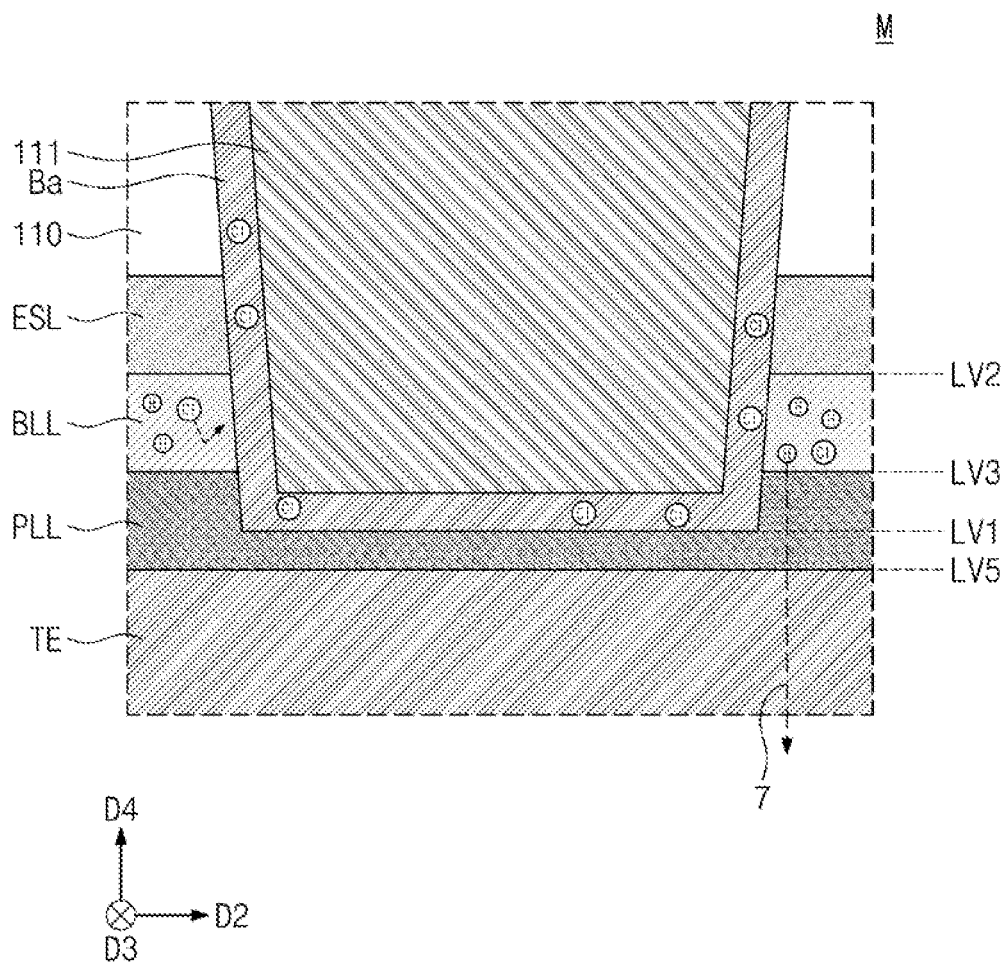
Figure 21:
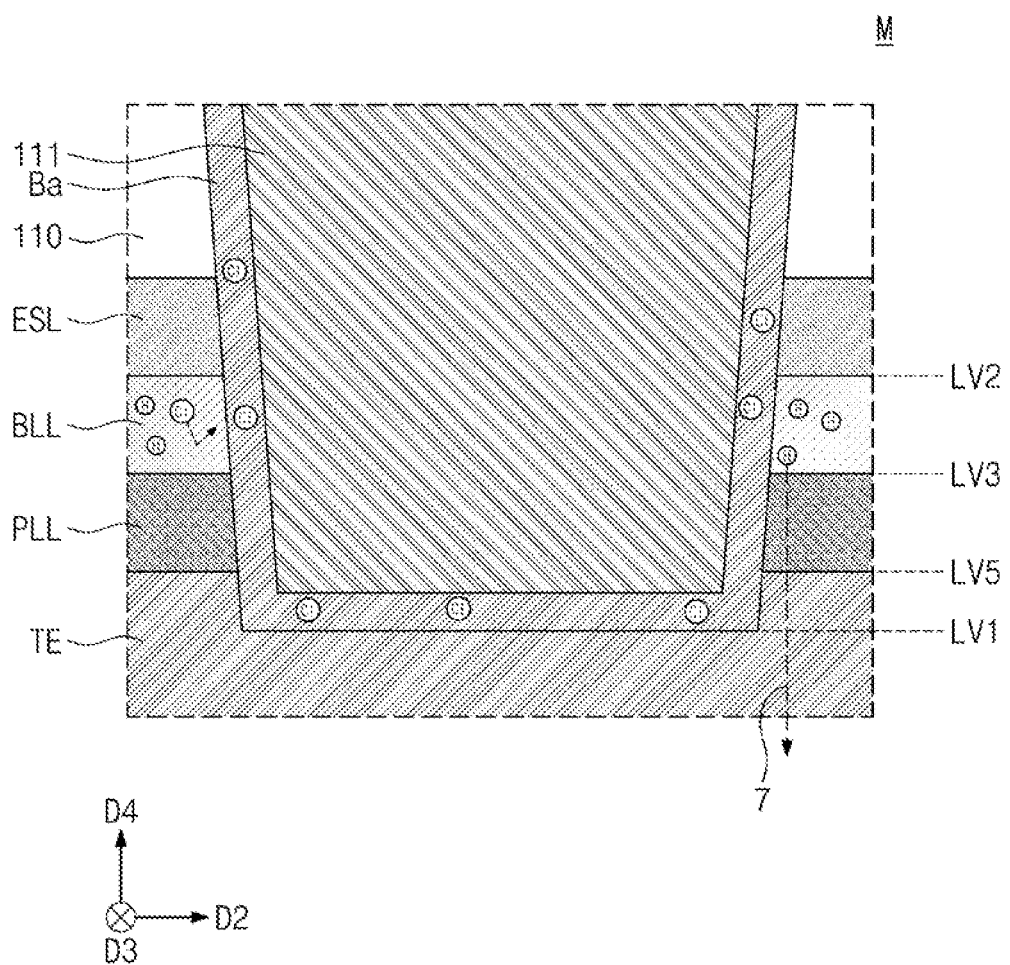

FIG. 18 is a sectional view taken along the line I-I' of FIG. 1 to illustrate a semiconductor device according to an embodiment. FIGS. 19 to 21 are enlarged sectional views, each of which illustrates a portion 'M' of FIG. 18. In the following description, an element previously described with reference to FIGS. 1 to 3 may be identified by the same reference number without repeating an overlapping description thereof, for concise description.

Referring to FIG. 18, the metal layer PLL may be conformally provided on the top electrode TE. As an example, the metal layer PLL may be in contact with the top and side surfaces (e.g., at least one side surface) of the top electrode TE. The blocking layer BLL may be conformally provided on the metal layer PLL. The etch stop layer ESL may be conformally provided on the blocking layer BLL. The etch stop layer ESL may be extended along the top and side surfaces (e.g., at least one side surface) of the top electrode TE.

Referring to FIG. 19, the first lower contact 111 may be provided to penetrate the etch stop layer ESL and to be in contact with the blocking layer BLL. The first level LV1 may be positioned between the second level LV2 and the third level LV3. The first lower contact 111 may be spaced apart from the metal layer PLL in the fourth direction D4.

Referring to FIG. 20, the first lower contact 111 may be provided to penetrate the etch stop layer ESL and the blocking layer BLL and to be in contact with the metal layer PLL. Above the top surface of the top electrode TE, a bottom surface of the metal layer PLL may be located at a fifth level LV5. A top surface of the metal layer PLL may be substantially located at the third level LV3. The first level LV1 may be positioned between the third level LV3 and the fifth level LV5.

Referring to FIG. 21, the first lower contact 111 may be provided to penetrate the etch stop layer ESL, the blocking layer BLL, and the metal layer PLL and to be in contact with the top electrode TE. On the top surface of the top electrode TE, a bottom surface of the metal layer PLL may be located at the fifth level LV5. The first level LV1 may be lower than the fifth level LV5.

Figure 22:
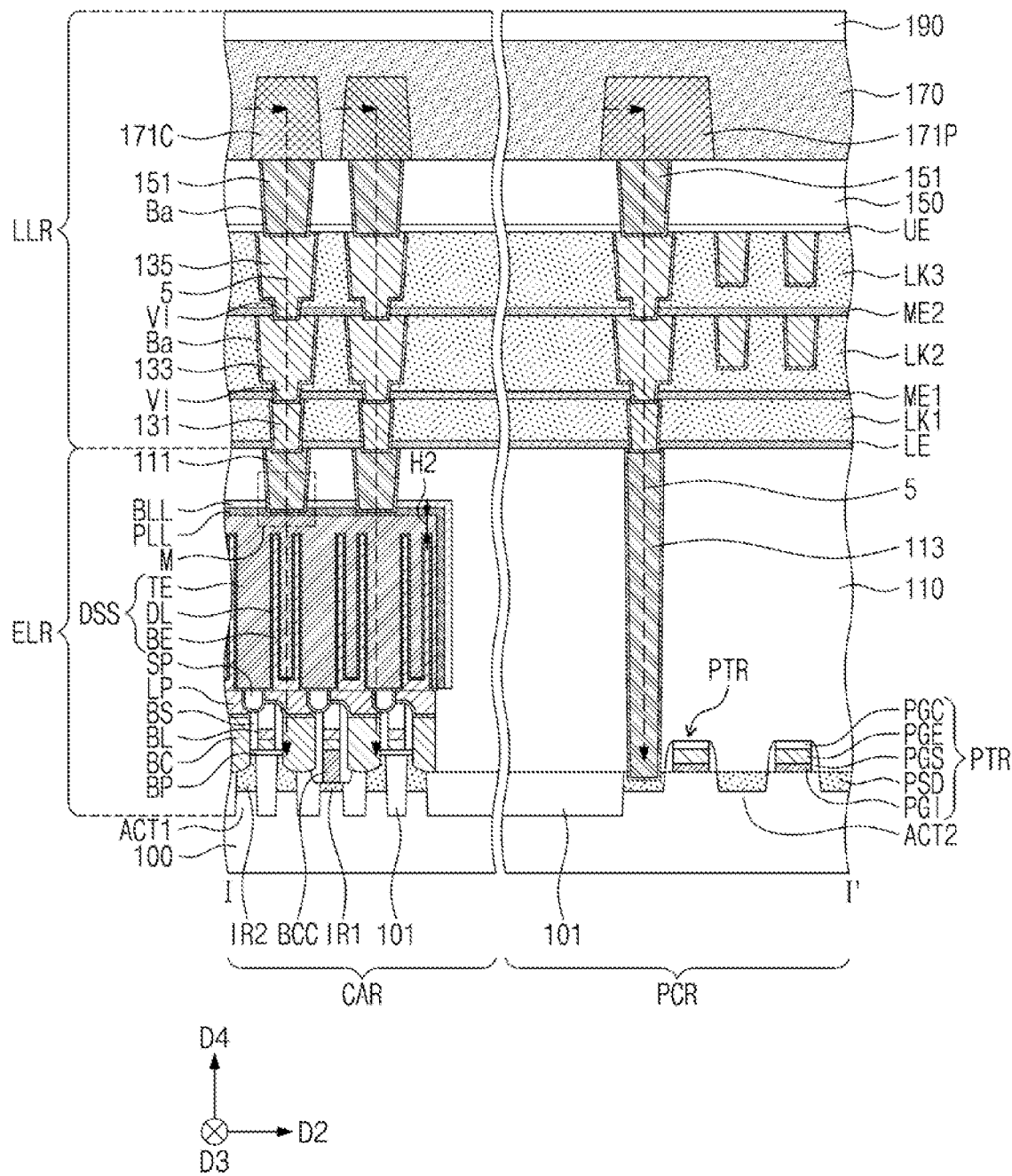
FIG. 22 is a sectional view taken along the line I-I' of FIG. 1 to illustrate a semiconductor device according to an embodiment.
Figure 23:
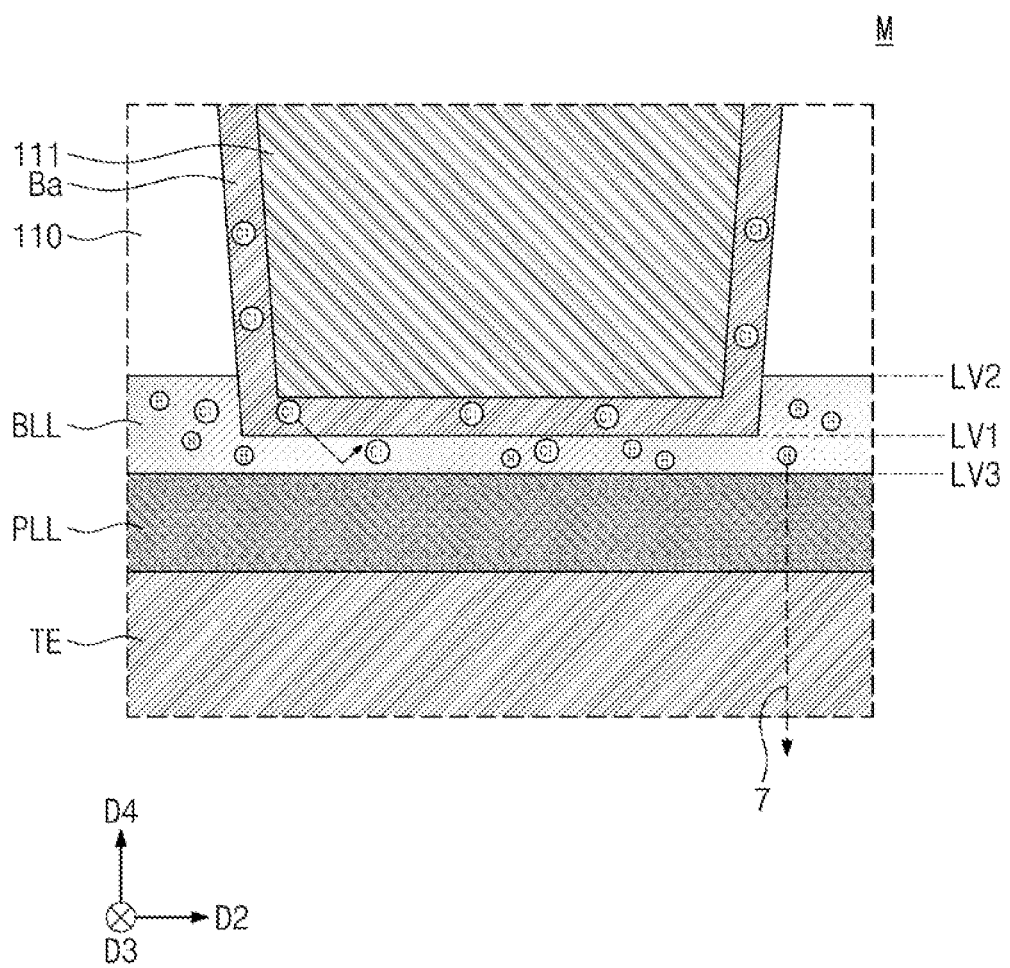
FIGS. 23 to 25 are enlarged sectional views, each of which illustrates a portion 'M' of FIG. 22.
Figure 24:
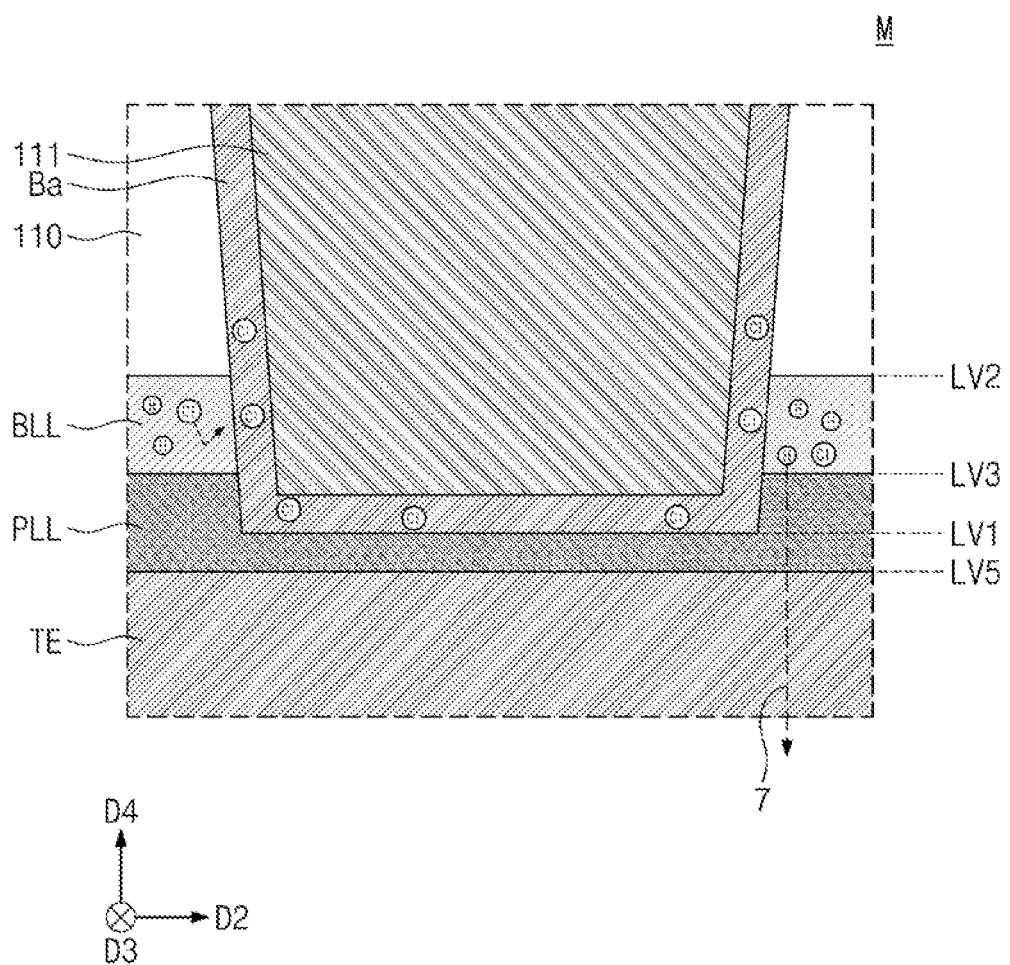
Figure 25:
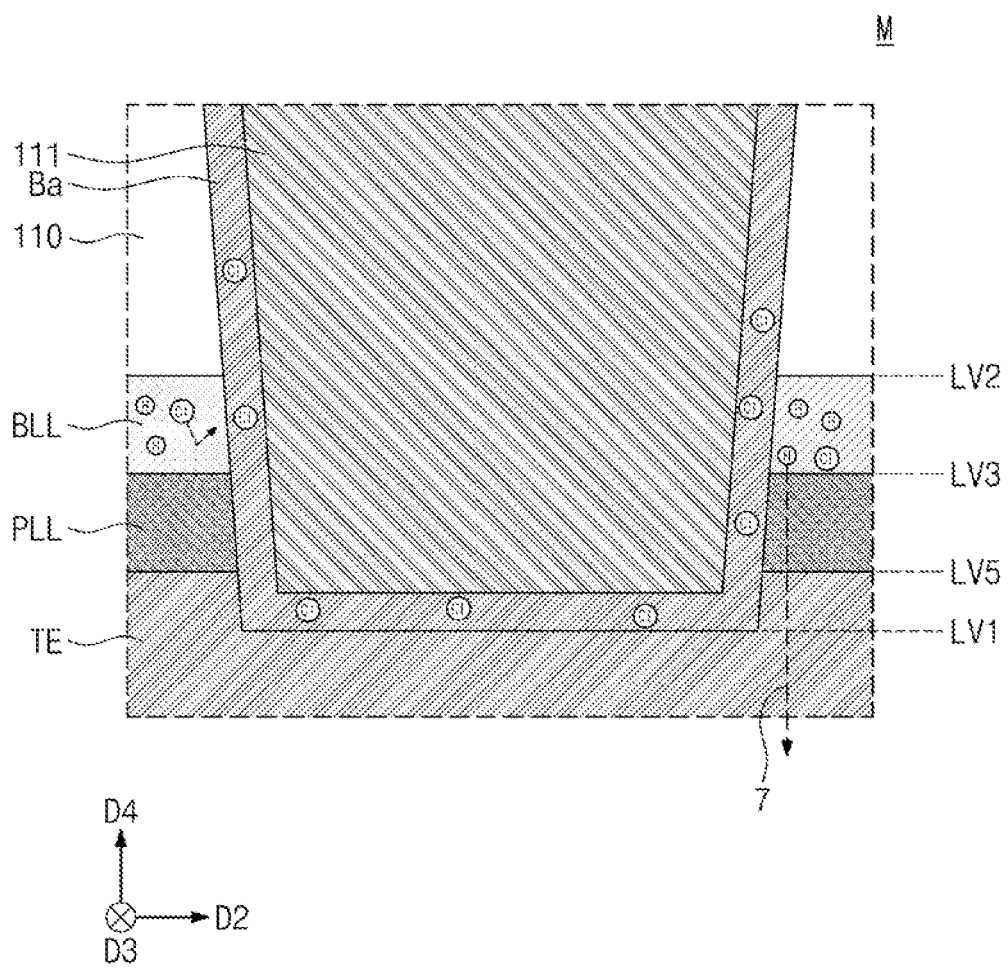

FIG. 22 is a sectional view taken along the line I-I' of FIG. 1 to illustrate a semiconductor device according to an embodiment. FIGS. 23 to 25 are enlarged sectional views, each of which illustrates a portion 'M' of FIG. 22. In the following description, an element previously described with reference to FIGS. 1 to 3 may be identified by the same reference number without repeating an overlapping description thereof, for concise description.

Referring to FIG. 22, the metal layer PLL may be conformally provided on the top electrode TE. In an embodiment, the metal layer PLL may be in contact with the top and side surfaces (e.g., at least one side surface) of the top electrode TE. The blocking layer BLL may be conformally provided on the metal layer PLL. The etch stop layer ESL described with reference to FIG. 18 may be omitted. In an embodiment, the blocking layer BLL may serve as both a blocking layer and an etch stop layer.

Referring to FIG. 23, the first lower contact 111 may be in contact with the blocking layer BLL. The first level LV1 may be positioned between the second level LV2 and the third level LV3. The first lower contact 111 may be spaced apart from the metal layer PLL in the fourth direction D4.

Referring to FIG. 24, the first lower contact 111 may be provided to penetrate the blocking layer BLL and to be in contact with the metal layer PLL. A top surface of the metal layer PLL may be located at the third level LV3. Above the top surface of the top electrode TE, a bottom surface of the metal layer PLL may be located at the fifth level LV5. The first level LV1 may be positioned between the third level LV3 and the fifth level LV5.

Referring to FIG. 25, the first lower contact 111 may be provided to penetrate the blocking layer BLL and the metal layer PLL and to be in contact with the top electrode TE. A top surface of the metal layer PLL may be located at the third level LV3. Above the top surface of the top electrode TE, a bottom surface of the metal layer PLL may be located at the fifth level LV5. The first level LV1 may be lower than the fifth level LV5.

Figure 26:
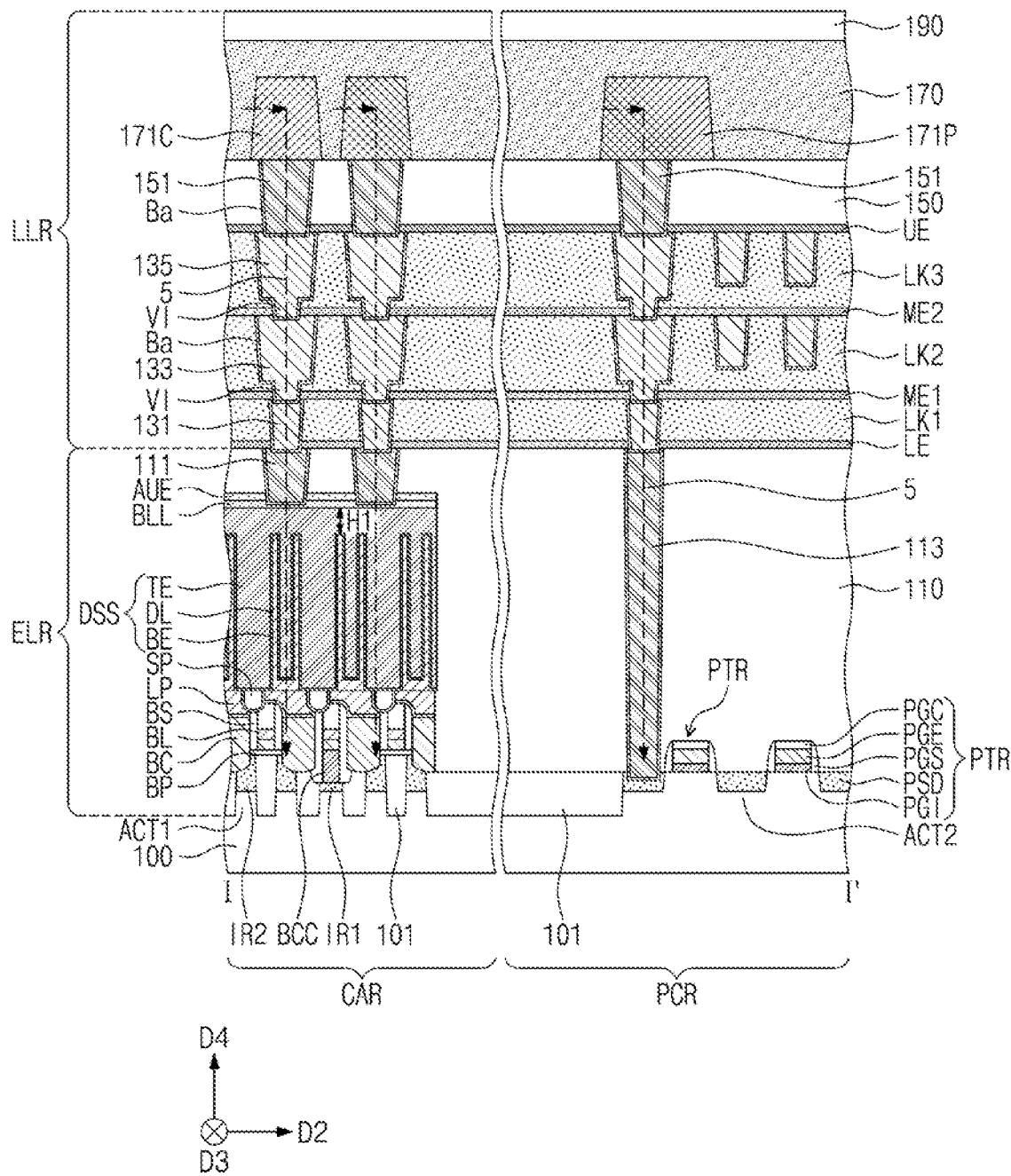
FIG. 26 is a sectional view taken along the line I-I' of FIG. 1 to illustrate a semiconductor device according to an embodiment.

FIG. 26 is a sectional view taken along the line I-I' of FIG. 1 to illustrate a semiconductor device according to an embodiment. In the following description, an element previously described with reference to FIGS. 1 to 3 may be identified by the same reference number without repeating an overlapping description thereof, for concise description.

Referring to FIG. 26, the blocking layer BLL may be locally provided on only the top surface of the top electrode TE. In other words, the blocking layer BLL may not be extended along the side surface of the top electrode TE. The auxiliary electrode AUE may not be extended along the side surface of the top electrode TE and may be locally provided on only the top surface of the blocking layer BLL.

The embodiments of FIGS. 10 to 25 may be configured to have substantially the same features as the semiconductor device of FIG. 26. In other words, the blocking layer BLL, the auxiliary electrode AUE, the metal layer PLL, and the etch stop layer ESL may not be extended along the side surface of the top electrode TE and may be locally provided on only the top surface of the top electrode TE.

According to an embodiment, a blocking layer may be provided on a top surface of a top electrode. The blocking layer may prevent chlorine ions, which are present in a barrier layer of a first lower contact, from being moved toward first active regions. In the case where chlorine ions are supplied to a cell array region, the chlorine ions may be combined with dangling bonds, and this may lead to a difficulty in supplying electrons to dangling bonds through hydrogen atoms. Since the movement of the chlorine ions is blocked by the blocking layer, it may be possible to prevent the problem.

Furthermore, in an alloy process, hydrogen atoms stored in the blocking layer may be moved toward the first active regions along an additional hydrogen supply path. That is, due to the blocking layer, it may be possible to additionally supply a large amount of hydrogen atoms to the cell array region. Accordingly, it may be possible to effectively reduce structural defects (e.g., the dangling bonds).

In the case where the chlorine ions are moved to a dielectric layer of a data storage structure and participate in a chemical reaction with the dielectric layer, a leakage current in the data storage structure may be increased. According to an embodiment, since the movement of the chlorine ions is blocked by the blocking layer, it may be possible to reduce the leakage current in the data storage structure. As a result, it may be possible to improve electric characteristics of a semiconductor device.

While example embodiments of the disclosure have been particularly shown and described, it will be understood by one of ordinary skill in the art that variations in form and detail may be made therein without departing from the spirit and scope of the attached claims.

What is claimed is:

1. A semiconductor device, comprising:
a substrate comprising a cell array region;
a data storage structure provided on the cell array region of the substrate, the data storage structure comprising a bottom electrode, a top electrode on the bottom electrode, and a dielectric layer between the bottom electrode and the top electrode;
a blocking layer on a top surface of the top electrode;
a lower interlayer insulating layer on the blocking layer; and
a lower contact penetrating the lower interlayer insulating layer, wherein the lower contact is electrically connected to the top electrode,
wherein at least a portion of a side surface of the lower contact contacts the blocking layer, and
wherein a bottom surface of the lower contact is spaced apart from a top surface of the top electrode.

2. The semiconductor device of claim 1, further comprising an auxiliary electrode on the blocking layer,
wherein the auxiliary electrode and the top electrode comprise a same material.

3. The semiconductor device of claim 2, wherein a thickness of the auxiliary electrode is smaller than a thickness of the blocking layer.

4. The semiconductor device of claim 1, wherein the blocking layer further extends along a side surface of the top electrode.

5. The semiconductor device of claim 1, wherein the blocking layer comprises at least one of silicon, silicon germanium, silicon nitride, silicon oxynitride, silicon carbonitride, silicon boron nitride, and carbon- and nitride-doped silicon oxide.

6. The semiconductor device of claim 1, wherein the bottom surface of the lower contact is between a top surface of the blocking layer and a bottom surface of the blocking layer.

7. The semiconductor device of claim 1, wherein the blocking layer and the top electrode comprise chlorine, and
wherein a chlorine concentration of the blocking layer is higher than a chlorine concentration of the top electrode.

8. The semiconductor device of claim 1, wherein the bottom surface of the lower contact is at a level lower than a bottom surface of the blocking layer.

9. The semiconductor device of claim 1, further comprising:
a metal layer on the blocking layer; and
an etch stop layer on the metal layer,
wherein the lower contact penetrates the etch stop layer.

10. The semiconductor device of claim 1, further comprising a metal layer interposed between the blocking layer and the top electrode.

11. A semiconductor device, comprising:
a substrate comprising a cell array region;
a data storage structure on the cell array region of the substrate;
a blocking layer on a top surface of the data storage structure;
a lower interlayer insulating layer on the blocking layer;
a lower contact penetrating the lower interlayer insulating layer, wherein the lower contact is electrically connected to the data storage structure;

a lower interconnection layer on the lower interlayer insulating layer, wherein the lower interconnection layer is electrically connected to the lower contact;

an interface layer on the lower interconnection layer; and an upper interlayer insulating layer on the interface layer, wherein a bottom surface of the lower contact is between a top surface of the blocking layer and a bottom surface of the blocking layer.

12. The semiconductor device of claim 11, further comprising a metal layer between the blocking layer and the data storage structure.

13. The semiconductor device of claim 12, further comprising an etch stop layer on the blocking layer.

14. The semiconductor device of claim 11, further comprising:

a metal layer on the blocking layer; and an etch stop layer on the metal layer, wherein the lower contact penetrates the metal layer and the etch stop layer.

15. The semiconductor device of claim 11, further comprising an auxiliary electrode on the blocking layer, wherein the auxiliary electrode comprises silicon germanium, and wherein the lower contact penetrates the auxiliary electrode.

16. A semiconductor device, comprising:

a substrate comprising a cell array region and a peripheral circuit region;

a data storage structure on the cell array region of the substrate, the data storage structure comprising a bottom electrode, a top electrode on the bottom electrode, and a dielectric layer between the bottom electrode and the top electrode;

peripheral transistors on the peripheral circuit region of the substrate;

a blocking layer on a top surface of the top electrode;

a lower interlayer insulating layer on the data storage structure and the peripheral transistors;

a lower contact penetrating the lower interlayer insulating layer, wherein the lower contact is electrically connected to the data storage structure;

a low-k dielectric layer on the lower interlayer insulating layer;

a first lower interconnection layer penetrates the low-k dielectric layer, wherein a first portion of the first lower interconnection layer is electrically connected to the lower contact and a second portion of the first lower interconnection layer is electrically connected to the peripheral transistors;

an interface layer on the first lower interconnection layer;

a first upper interlayer insulating layer on the interface layer;

an upper contact penetrates the first upper interlayer insulating layer and the interface layer, wherein a first portion of the upper contact is connected to the first portion of the first lower interconnection layer and a second portion of the upper contact is connected to the second portion of the first lower interconnection layer;

a first upper interconnection layer and a second upper interconnection layer on the first upper interlayer insulating layer, wherein the first upper interconnection layer is electrically connected to the first portion of the upper contact and the second upper interconnection layer is electrically connected to the second portion of the upper contact;

a second upper interlayer insulating layer on the first upper interconnection layer and the second upper interconnection layer; and a passivation layer on the second upper interlayer insulating layer, wherein at least a portion of a side surface of the lower contact contacts the blocking layer.

17. The semiconductor device of claim 16, further comprising a metal layer provided on the blocking layer, wherein a bottom surface of the lower contact is between a top surface of the metal layer and a bottom surface of the metal layer.

18. The semiconductor device of claim 16, wherein a bottom surface of the lower contact is between a top surface of the blocking layer and a bottom surface of the blocking layer.

19. The semiconductor device of claim 16, wherein the blocking layer comprises at least one of silicon, silicon germanium, silicon nitride, silicon oxynitride, silicon carbonitride, silicon boron nitride, and carbon- and nitride-doped silicon oxide, and wherein the semiconductor device further comprises a barrier layer, which extends along a bottom surface and side surfaces of the lower contact.

20. The semiconductor device of claim 16, wherein a bottom surface of the blocking layer contacts the top electrode.

* * * * *